(12) United States Patent
Lucas et al.

(10) Patent No.: US 11,927,431 B1
(45) Date of Patent: Mar. 12, 2024

(54) FIRING SWITCH FOR COMPACT CAPACITIVE DISCHARGE UNIT

(71) Applicant: Northrop Grumman Systems Corporation, Falls Church, VA (US)

(72) Inventors: James D. Lucas, Chanhassen, MN (US); Eric M. McDonough, Minneapolis, MN (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 980 days.

(21) Appl. No.: 16/602,843

(22) Filed: Dec. 10, 2019

Related U.S. Application Data

(60) Provisional application No. 62/917,491, filed on Dec. 11, 2018.

(51) Int. Cl.
| | |
|---|---|
| *F42B 3/12* | (2006.01) |
| *F42C 11/04* | (2006.01) |
| *F42D 1/05* | (2006.01) |
| *H01L 23/498* | (2006.01) |
| *H05K 1/18* | (2006.01) |

(52) U.S. Cl.
CPC .............. *F42B 3/124* (2013.01); *F42C 11/04* (2013.01); *F42D 1/05* (2013.01); *H01L 23/49811* (2013.01); *H05K 1/181* (2013.01); *F42B 3/121* (2013.01); *H05K 2201/10015* (2013.01); *H05K 2201/10166* (2013.01); *H05K 2201/10522* (2013.01); *H05K 2201/10628* (2013.01); *H05K 2201/10757* (2013.01)

(58) Field of Classification Search
CPC .......... F42B 3/121; F42B 3/124; F42C 11/04; F42D 1/05; H01L 23/49811; H05K 1/181; H05K 2201/10015; H05K 2201/10166; H05K 2201/10522; H05K 2201/10628; H05K 2201/10757
USPC ..... 361/247, 248, 251, 256, 257; 102/202.5, 102/202.7, 202.9, 202.12, 202.14, 206, 102/218, 220
See application file for complete search history.

(56) References Cited

U.S. PATENT DOCUMENTS

| | | | |
|---|---|---|---|
| 5,489,909 A | | 2/1996 | Dittmann et al. |
| 5,731,538 A | * | 3/1998 | O'Brien .................... F42B 3/13 |
| | | | 102/202.7 |

(Continued)

FOREIGN PATENT DOCUMENTS

| | | | | |
|---|---|---|---|---|
| CN | 110411285 B | * | 1/2022 | .............. F42B 3/121 |
| EP | 2549220 A1 | * | 1/2013 | .............. F42B 3/121 |

*Primary Examiner* — Joshua E Freeman
*Assistant Examiner* — Benjamin S Gomberg
(74) *Attorney, Agent, or Firm* — Christensen Fonder, Dardi & Herbert PLLC

(57) ABSTRACT

A capacitive discharge unit (CDU) for detonating an explosive in response to a control signal comprises a set of CDU components, including an exploding foil initiator (EFI), a trigger circuit, a firing capacitor, and an insulated-gate bipolar transistor (IGBT) firing switch. In various embodiments the components are arranged on a board for mechanically and electrically supporting the components in an ordered arrangement along a CDU axis where the CDU having an axial length defined by the ordered arrangement of two or more of the EFI, the firing capacitor, and the IBGT firing switch, wherein the trigger circuit is offset from the CDU axis such that the trigger circuit does not contribute to the axial length.

20 Claims, 18 Drawing Sheets

(56) References Cited

U.S. PATENT DOCUMENTS

| | | | |
|---|---|---|---|
| 6,079,332 A * | 6/2000 | Marshall | F42C 19/00 |
| | | | 102/202.5 |
| 6,138,517 A | 10/2000 | Laursen et al. | |
| 6,138,571 A * | 10/2000 | Denney | F42C 11/008 |
| | | | 102/206 |
| 6,389,975 B1 * | 5/2002 | Haddon | F42C 11/008 |
| | | | 102/202.8 |
| 6,404,065 B1 | 6/2002 | Choi | |
| 6,476,481 B2 | 11/2002 | Woodworth et al. | |
| 6,591,754 B1 * | 7/2003 | Baur | H01R 13/665 |
| | | | 102/206 |
| 6,634,298 B1 * | 10/2003 | Denney | F42B 3/10 |
| | | | 102/206 |
| 6,966,261 B2 * | 11/2005 | Keil | F42C 15/40 |
| | | | 102/202.3 |
| 7,199,461 B2 | 4/2007 | Son et al. | |
| 7,236,345 B1 * | 6/2007 | Roesler | F42B 3/121 |
| | | | 361/247 |
| 7,305,467 B2 | 12/2007 | Kaiser et al. | |
| 7,334,523 B2 * | 2/2008 | Lucas | F42B 3/18 |
| | | | 102/202.7 |
| 8,091,477 B2 * | 1/2012 | Brooks | E21B 43/1185 |
| | | | 361/251 |
| 8,812,654 B2 | 8/2014 | Gelvin et al. | |
| 8,832,244 B2 | 9/2014 | Gelvin et al. | |
| 8,836,503 B2 | 9/2014 | Gelvin et al. | |
| 8,931,415 B2 | 1/2015 | Volkmann | |
| 8,976,503 B2 * | 3/2015 | Overbey | F42C 19/12 |
| | | | 361/248 |
| 9,013,154 B2 | 4/2015 | O'Sullivan | |
| 9,041,172 B1 | 5/2015 | Niu et al. | |
| 9,115,970 B2 * | 8/2015 | DeVries | F42D 1/045 |
| 9,347,755 B2 * | 5/2016 | Backhus | F42B 3/182 |
| 9,824,996 B2 | 11/2017 | Satou et al. | |
| 10,054,404 B2 | 8/2018 | Balk et al. | |
| 10,615,695 B1 * | 4/2020 | Pirozzi | F42B 3/18 |
| 2018/0288878 A1 * | 10/2018 | Brucchi | H01R 12/585 |

* cited by examiner

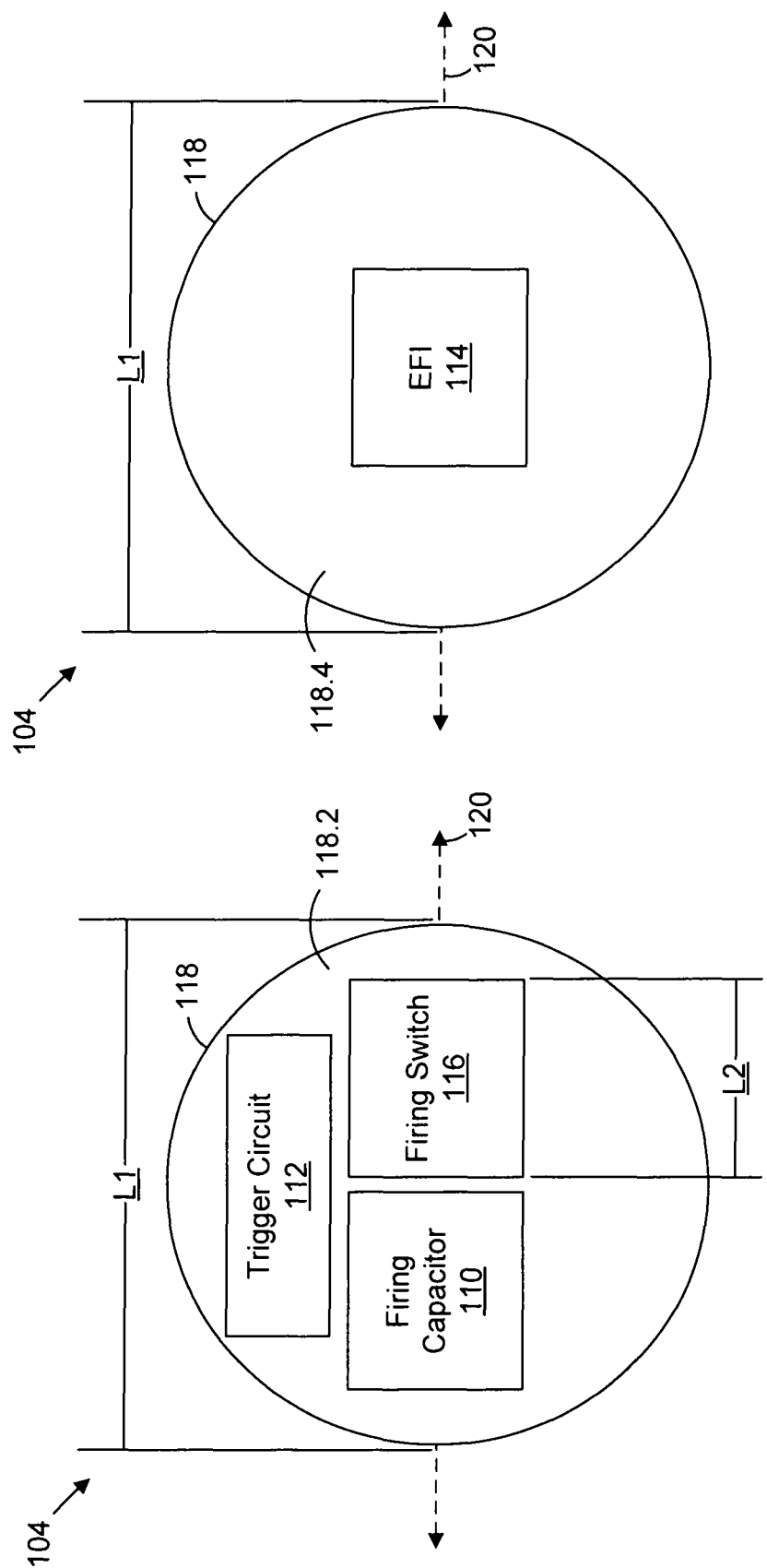

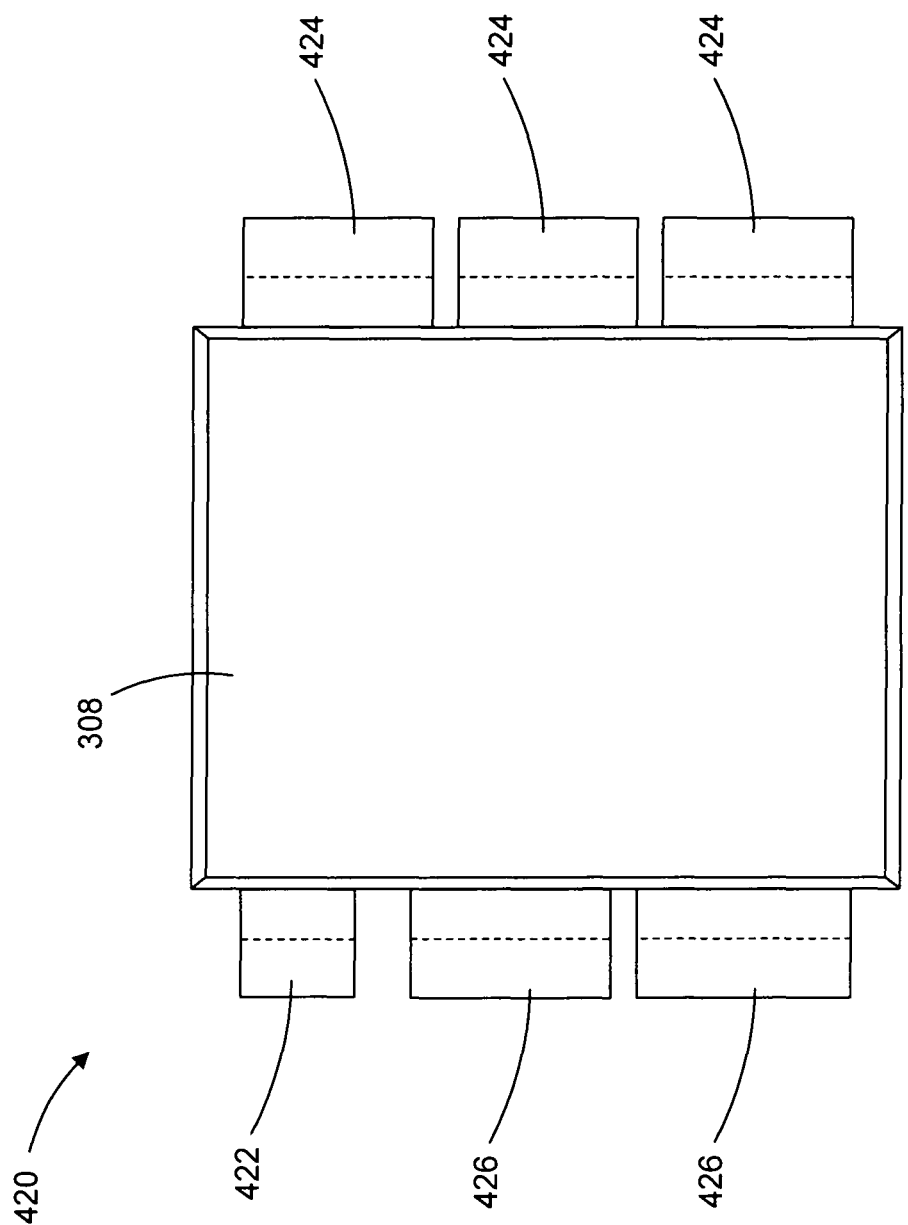

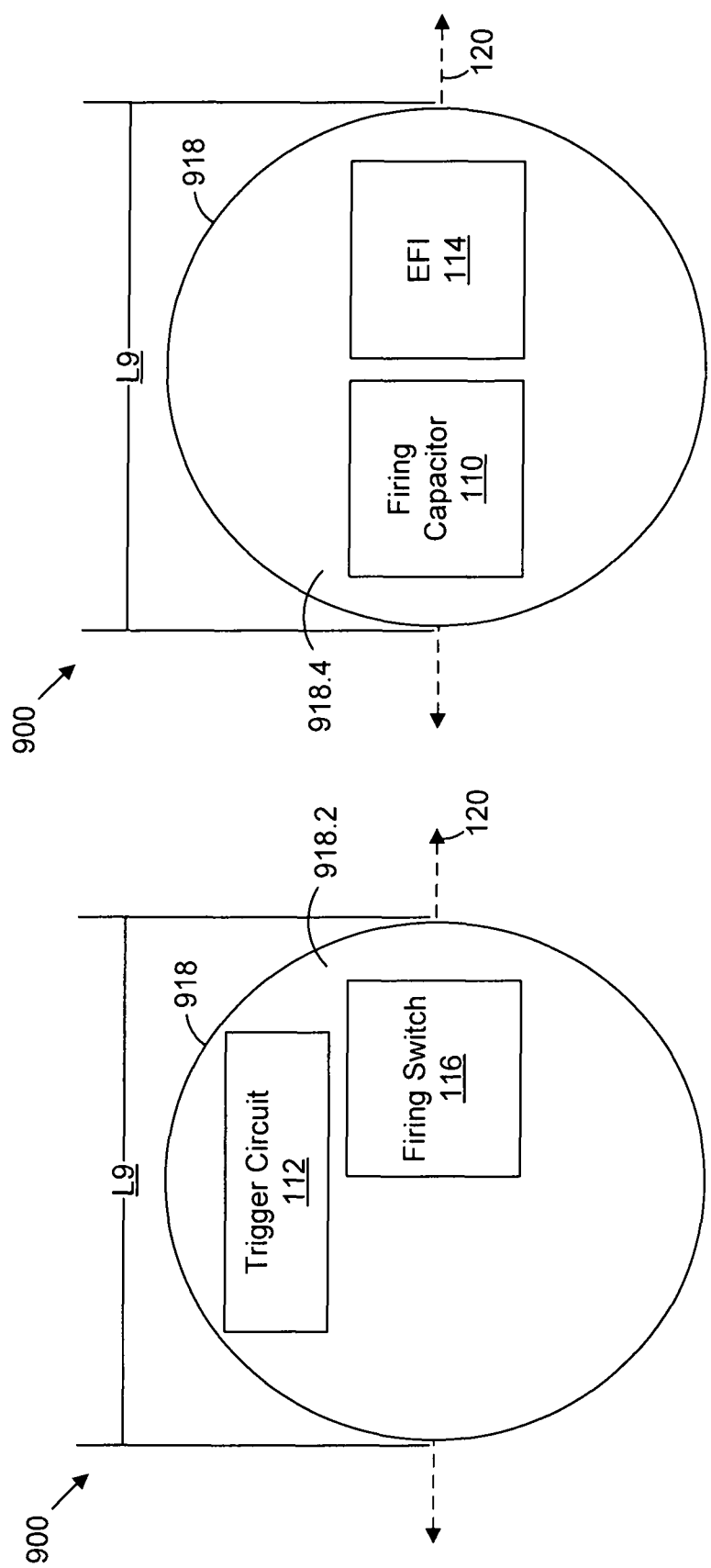

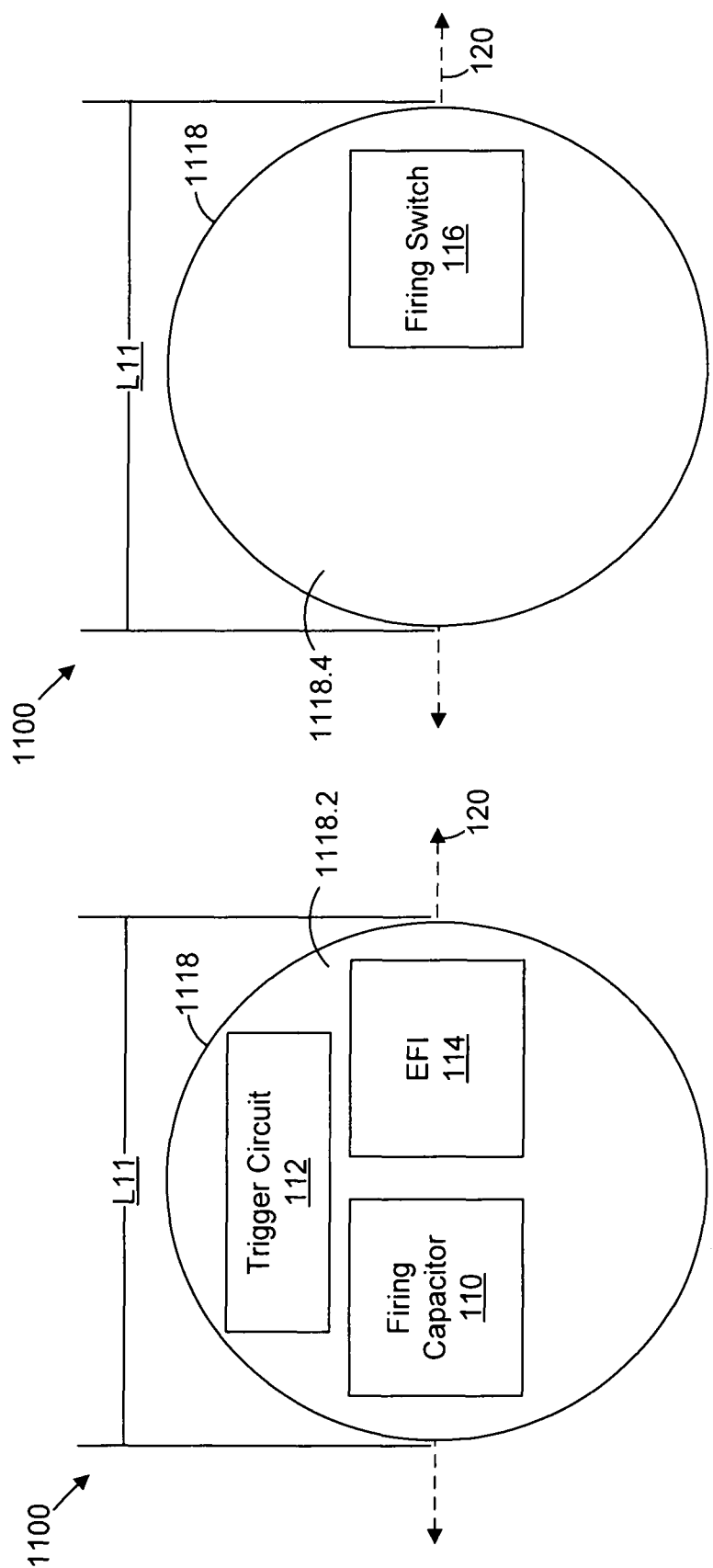

FIRING SWITCH FOR COMPACT CAPACITIVE DISCHARGE UNIT

RELATED APPLICATIONS

This application claims priority to U.S. Provisional Application No. 62/917,491, filed Dec. 11, 2018, the contents of which are hereby incorporated by reference in their entirety.

TECHNICAL FIELD

The present disclosure relates generally to initiation systems for explosive devices. More particularly, the disclosure relates to capacitive discharge units (CDU) for munitions.

BACKGROUND

Various military munition systems have long employed the use of explosive materials or ordnance. Such munitions systems are generally fired or otherwise delivered to a target where the explosive ordnance of the munition can be detonated to cause damage via an explosive release of stored potential energy. As used herein the term "detonation", "detonate", or the like, describes a chemical reaction that occurs within an explosive material that releases the stored potential energy and where the chemical reaction moves through the material at a rate that is faster than the speed of sound (e.g. 340 meters per second).

Explosive material of munition ordnance will generally require an explosive initiator in order to cause an explosive chemical reaction, as the type of ordnance utilized in most military munitions will have a reduced sensitivity such that simple heat or shock to the explosive ordnance will not cause detonation to occur. As such, munition ordnance is generally configured with a detonation device that functions as an explosive initiator or detonator.

Detonator devices can cause explosive material to be detonated in several different ways. For example, explosive materials have been ignited by flame ignition (e.g., fuzes or ignition of a priming explosive), impact (which often ignites a priming explosive), chemical interaction (e.g., contact with a reactive or activating fluid), or electrical ignition. Electrical ignition may occur in at least two distinct ways, including by way of ignition of a priming material (e.g., electrically ignited blasting cap or priming material) or by way of direct energization of an explosive mass by electrical power. These various ignition systems enable explosive devices, such as explosive projectiles, to detonate at a desired time, altitude, distance, etc. Further, depending on the application of the explosive device, this desired detonation can occur upon impact, before impact, at a specific point during flight, or at some time after impact.

As an example of electrical ignition, a detonator device can be configured as a capacitive discharge unit (CDU) that includes an exploding foil initiator (EFI) used to detonate munitions. Activating an EFI requires a high current pulse with a very short rise time. In some CDUs, the pulse is generated by discharging a large voltage capacitor through a spark gap switch or a Metal Oxide Semiconductor Controlled Thyristor (MCT) switch. An improved detonator device that realizes efficient, reliable, and high-speed detonation would be welcome.

SUMMARY

Embodiments of the disclosure are directed to a compact capacitive discharge unit (CDU) for causing detonation of explosive material in response to a control signal. In one or more embodiments, the CDU comprises a set of CDU components, including an exploding foil initiator (EFI), a trigger circuit, a firing capacitor, and a firing switch. The CDU further includes a circuit board for mechanically and electrically supporting the set of CDU components in an ordered arrangement along a CDU axis.

As used herein the term CDU axis refers to an axis that runs along two or more adjacent CDU components that together define the width requirements for the circuit board. The CDU axis runs through these components in their ordered arrangement on the board and defines a minimum axial length, measured along the CDU axis, required to accommodate the ordered arrangement.

Various embodiments of the disclosure are directed to an improved CDU design providing a compact arrangement of components and compact CDU design relative to known CDUs. In such embodiments, the compactness can be realized via an improved design for the firing switch of the CDU that decreases its size and, as a result, decreases its share of the total axial length of the CDU. For example, in various embodiments the axial length of the firing switch is not more than 35% of the total axial length of the CDU. In some embodiments, compactness can be realized via an improved design that allows for certain components to be positioned on the circuit board offset from the CDU axis such that the offset component does not contribute to the axial length of the CDU.

Further, various embodiments of a compact CDU provide advantages as a result of its smaller size. For example, by reducing the size of the CDU certain embodiments free up additional space within a munition for additional explosive ordnance or other components that can provide enhanced functionality. Alternatively, a reduced CDU size allows for use of an advanced CDU in smaller munitions or for the reduction of size of existing munitions. In addition, a smaller CDU can improve component survivability. Larger CDUs have been known to crack when exposed to significant G-forces, such as when a munition is launched or upon impact with a target. This is particularly true for smaller barrel fired projectiles, which can subject munition components to even larger G-forces.

Another advantage of various embodiments is an improved compact CDU that is electrically compatible with current munitions. This allows the improved CDU to be used in existing munitions without any further costs associated with redesign or reconfiguration of existing munitions. As such, existing munitions may claim the benefits of the improved CDU, such as improved survivability and additional available space within the munition for ordnance or other components.

As such, one or more embodiments of the disclosure are directed to a firing switch for a compact CDU. In various embodiments, the firing switch is configured as an insulated gate bipolar transistor (IGBT) firing switch for improved efficiency and switching speed, described further below. In certain embodiments the firing switch includes a gate pin, a collector pin, an emitter pin, and a die having one or more substrate layers. In one or more embodiments, the firing switch further includes a package for containing and/or protecting the die. In such embodiments, the die is positioned at least partially within the package with the gate pin, collector pin, and emitter pin each having a first end portion extending into the package to provide an electrical connection into the interior of the package and to the die.

In various embodiments, the gate pin, emitter pin, and collector pin each include a second end portion extending outwardly from the package and each having a pin length—defined as the length of the pin from the exterior of the package to the end of the pin. In one or more embodiments, the gate pin of the firing switch is positioned adjacent to, at most, one individual pin of the collector pin and the emitter pin. As such, in various embodiments, the gate pin will be positioned adjacent to no more than one other individual pin.

In various embodiments, the positioning of the gate pin as adjacent to no more than one other pin allows for an axial reduction in size of a CDU by allowing for shortened pin lengths for the gate pin, emitter pin, and collector pin, as compared to known firing switch designs. In addition, the placement of the gate pin, adjacent to, at most, one of the collector pin and the emitter pin, permits a trigger circuit to be offset from the CDU axis. Further, having the gate pin adjacent to, at most, one of the collector pin and the emitter pin, permits alternate trigger circuit designs which may further reduce the axial length of the trigger circuit, thereby resulting in further reductions in the overall axial length of the CDU.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

FIGS. 1C-1D depict high-level views of a CDU, according to one or more embodiments of the disclosure.

FIGS. 4A-4B depict various designs for an IGBT firing switch, according to one or more embodiments of the disclosure.

FIGS. 9A-9B depict high-level views of a CDU, according to one or more embodiments of the disclosure.

FIGS. 11A-11B depict high-level views of a CDU, according to one or more embodiments of the disclosure.

Figure 1A:
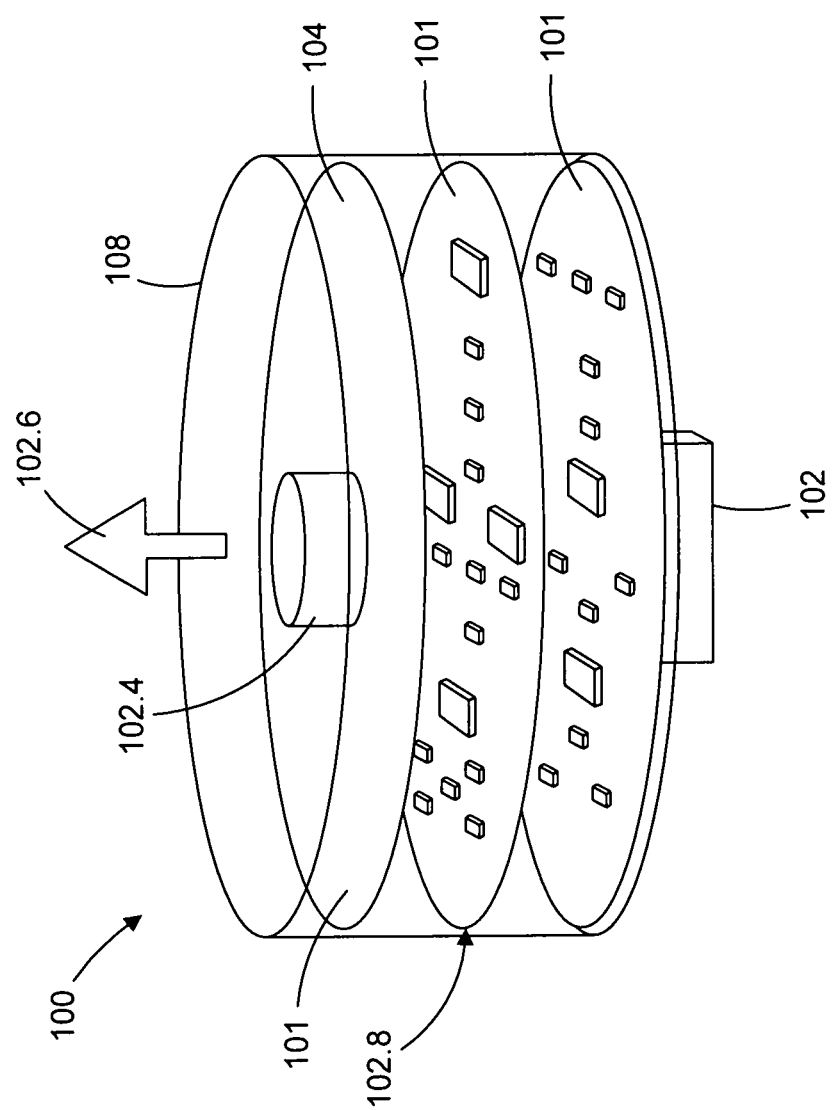
FIG. 1A depicts a perspective view of a detonator device including a CDU, according to one or more embodiments of the disclosure.

While the embodiments of the disclosure are amenable to various modifications and alternative forms, specifics thereof have been shown by way of example in the drawings and will be described in detail. It should be understood, however, that the intention is not to limit the disclosure to the embodiments described. On the contrary, the intention is to cover all modifications, equivalents, and alternatives falling within the spirit and scope of the disclosure.

DETAILED DESCRIPTION

FIG. 1A depicts a high-level view of detonation device 100 including a capacitive discharge unit (CDU) 104 for detonating an explosive device, according to one or more embodiments of the disclosure. In various embodiments the detonation device 100 includes electronic circuitry that is configured to initiate an explosive detonation of explosive material in response to receiving an electronic control signal or other input. In one or more embodiments, the detonation device 100 includes one or more circuit boards 101 including the CDU 104, an input/output connector 102, and an explosive initiator 102.4. In various embodiments, the one or more circuit boards 101 includes the various electronic circuitry of the detonation device 100. In such embodiments the circuit boards 101 are connected to one another and stacked or arranged to achieve a generally compact shape for the detonation device 100. For example, depicted in FIG. 1A, the circuit boards 101 each have a generally circular shape and are staked over one another to form a generally cylindrical stack 102.8 of electrical components and circuit boards 101.

In one or more embodiments, the cylindrical stack 102.8 is encased within a potting 108 to form a column composed of epoxy or other material for containing various componentry of the detonation device 100 and to keep the circuit boards 101 arranged in their stacked formation. In such embodiments, the potting 108 can be composed of generally or non-conductive material. In various embodiments the potting 108 is additionally configured to support the components of the detonation device 100 in assembly and/or to protect the various interior components of the device 100 from shock or other damage. In various embodiments, and described further below, the size of the one or more circuit boards 101 will define the overall size of the detonation device 100. For instance, and described further below, because the circuit boards 101 are sized to accommodate the size of the electronic circuitry on the boards, the size and/or positioning of the electronic components can result in significant size reductions to the circuit boards 101 and thus to the detonation device 100 itself.

For example, in the case of a circular shaped circuit board and cylindrical detonation device 100 as depicted in FIG. 1A, size reductions to the overall diameter of the circuit boards will provide a corresponding exponential reduction in the overall volume of the detonation device 100. However, in one or more embodiments, the circuit boards could have any suitable shape. Further, while FIG. 1A depicts the detonation device 100 as including three circuit boards 101 in certain embodiments the detonation device 100 could have a larger number or smaller number of circuit boards arranged in the component stack.

Figure 1B:
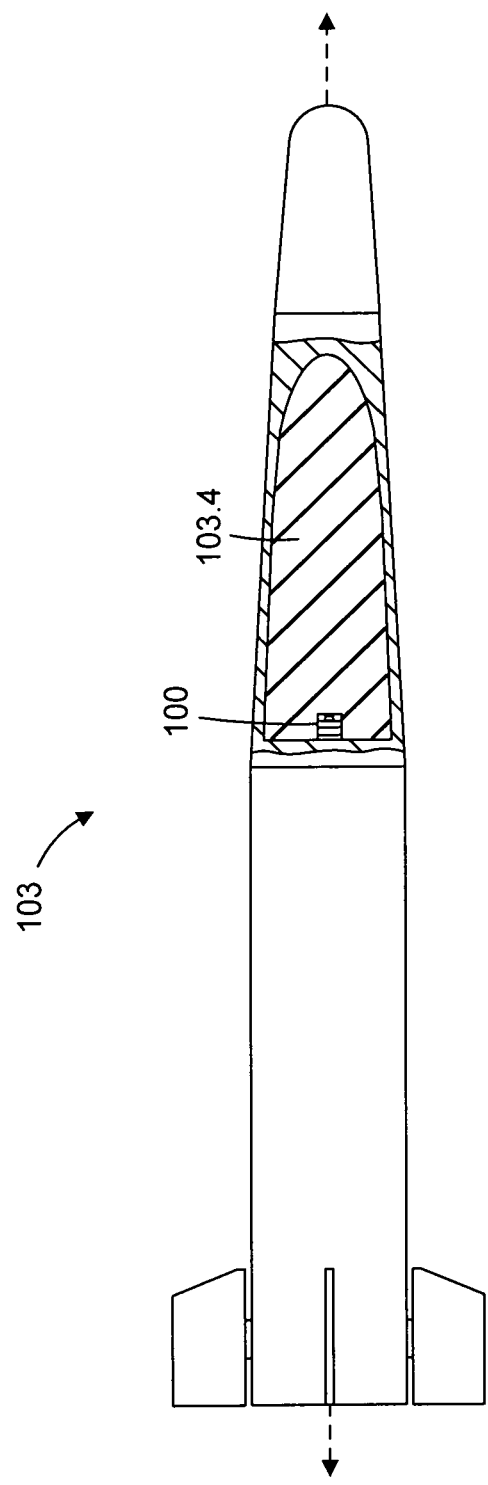
FIG. 1B depicts a projectile including a detonator device with CDU, according to one or more embodiments of the disclosure.

Referring to FIG. 1B, an example munition 103 including the detonation device 100 is depicted according one or more embodiments. The reduction in the overall volume of the detonation device 100 provides advantages to its use as a munitions fuze. For example, by reducing the size of the detonation device 100, the device 100 provides detonation capabilities while freeing up space within the munition 103 for additional explosive ordnance 103.4 or other components that could provide enhanced functionality. Alternatively, a reduced size for the detonation device 100 allows for use of electronic fuzing means in smaller munitions that are typically forced to employ smaller mechanical fuzing means. For example, certain embodiments can be utilized in 30 mm projectiles. As such, various embodiments of the disclosure allow for medium caliber munitions or other smaller munitions to realize the benefits of electronic fuzing. For instance, electronic fuzing devices generally contain no moving parts and can be fully tested and verified for functionality prior to assembly. Further, detonation devices 100 of the disclosure utilize secondary explosives for initiating detonation, providing a more stable/safer detonation device in comparison with mechanical fuzes. As a result, various embodiments can realize improved reliability, survivability, and safety.

Referring again to FIG. 1A, in various embodiments, and described further below, the explosive initiator 102.4 is a device configured to directly cause an explosive detonation of explosive material. Specifically, in one or more embodiments, and described further below, the explosive initiator is an explosive foil initiator (EFI) configured to receive an energy burst and, in response, provide an explosive release of energy that is sufficient to trigger a larger detonation of associated explosive material, such as the explosive ordnance 103.4 in FIG. 1B. Depicted in FIG. 1A, the explosive initiator 102.4 is oriented to provide the explosive release of energy in a direction indicated by arrow 102.6—outwardly and away from the detonator device 100.

In one or more embodiments the input/output connector 102 is a connector configured with a bus or other system that connects the various electronic circuitry of the detonator device 100. In such embodiments, the input/output connector 102 can receive or transmit various electronic signals or other data to/from components in the detonator device 100. In certain embodiments, the input/output connector 102 can receive and distribute power to one or more components of the detonator device from an externally located power source. In certain embodiments, additional components could be included in the potting 108. For example, the detonation device 100 could additionally include a power supply or other components within the potting and coupled with the CDU 104.

Referring to FIGS. 1C–1D, high level views of the CDU 104 is depicted, according to one or more embodiments. In various embodiments the CDU 104 is configured for directly causing an explosive chemical reaction in associated explosive material. As such, in various embodiments the CDU 100 is generally configured to store electricity within an onboard capacitor and to release that stored energy in a large burst in response to an input, such as the trigger of a switch, a received signal, or other input. In such embodiments, the CDU 104 can provide a high energy burst that can ultimately be used to cause detonation of an associated explosive ordnance.

As used herein, the term "burst" or "energy burst" refers to a high-voltage or high-current electrical pulse that is delivered within a single short-duration. For instance, in various embodiments an energy burst refers to a capacitor with voltage discharge in a range of 500 volts to 1600 volts discharged within 60 to 120 nanoseconds. However, the exact voltage discharge and rate of discharge can vary in one or more embodiments.

In various embodiments the CDU 104 includes one or more components including, but not limited to, a firing capacitor 110, a trigger circuit 112, an exploding foil initiator (EFI) 114, and a firing switch 116. In such embodiments, each of the CDU components are mounted on a shared circuit board 118. Depicted in FIG. 1, the components of the CDU are represented in a high-level view that depicts the relative positions of the components on the circuit board 118 and the relative area/space on the shared circuit board 118 that each component occupies.

In various embodiments, the firing capacitor 110 is a high-voltage capacitor configured to provide a requisite voltage/current required for causing explosive initiation via the EFI 114, described further below. In some embodiments, the firing capacitor 110 may be a high-voltage capacitor. In some embodiments, the firing capacitor 110 has a capacitance of about 0.15 µF and is capable of being charged to about 1000 V. In some embodiments the firing capacitor 110 is capable of being charged to a voltage in the range of 500V to 2000V.

In various embodiments the trigger circuit 112 is electrical circuitry configured to initiate discharge of the firing capacitor 110. Described further below with reference to FIG. 2, in various embodiments the firing capacitor is configured to control voltage application to the gate of the firing switch 116 to trigger the discharge of the firing capacitor 110.

In various embodiments, the EFI 114 is an explosive initiator device configured to directly cause an explosive detonation of explosive material. Specifically, in one or more embodiments the EFI 114 is an electrical initiator configured to receive an energy burst from the firing capacitor 110 and, in response, provide an explosive release of energy that is sufficient to trigger a larger detonation of associated explosive material.

In various embodiments, the EFI 114 generally comprises a thin metal wire or strip which is electrically connected with the firing capacitor 110. In such embodiments, energy from the firing capacitor 110 causes the metal to explosively vaporize. In some embodiments the EFI 114 has an object such as a pellet that, when the metal is vaporized, is launched at high speed with enough force to cause an explosive detonation. In some embodiments, the EFI 114 is a low-energy exploding foil initiator (LEEFI). LEEFIs generally require a fast rate of change of current at a high voltage in order to impart the detonation process. In various embodiments the EFI 114 requires a voltage greater than 1500 Volts to cause an explosive vaporization of the metal. In certain embodiments, such as where the EFI 114 is configured as a LEEFI, the EFI 114 can be configured to cause metal vaporization at lower voltages. For example, the EFI 114 could require about 1000 Volts for explosive vaporization. In certain embodiments, the voltage required to cause explosive vaporization is in a range between and including about 500 volts to and about 1500 volts.

In various embodiments, the firing switch 116 is a three terminal semiconductor configured as an electronic switch for causing a discharge of the firing capacitor 110. In certain embodiments the firing switch 116 is an insulated gate bipolar transistor (IGBT) firing switch. In one or more embodiments an IGBT firing switch 116 includes one or more alternating layers that are controlled by a metal-oxide semiconductor (MOS) gate structure. In such embodiments the IGBT firing switch is an electronic switch configured to combine high efficiency and fast switching compared to non-IGBT firing switches. For example, prior CDUs have used spark gap switch (vacuum tube switch) or Metal Oxide Semiconductor Controlled Thyristor (MCT) switch technologies. These older switch technologies have physical and electrical limitations including limited testability, limited shock survivability, and requirements such as additional support circuitry. An IGBT firing switch generally offers improvements on these physical and electrical limitations. In addition, IGBT firing switches may be obtained at much lower cost than previous technologies—a particularly important factor for use in explosive devices whose components are not reusable.

In some embodiments, the firing switch 116 provides about 2000 Amperes in a 100 nanosecond rate of rise into a 0.25 ohm load. In various embodiments this rate of change of current is capable of imparting LEEFI detonation and is not found in comparable MOSFET devices or other inexpensive commercially available IGBT switches.

In various embodiments, and described further below, the firing switch 116 includes a gate pin, a collector pin, an emitter pin, and a die having one or more substrate layers In various embodiments the gate pin, emitter pin, and collector pin can each be composed of one or more individual pins that together make up a general pin structure for each of the gate pin, emitter pin, and collector pin. For example, described further below in certain embodiments the collector pin and/or emitter pin could each be composed of a plurality of individual pins that each function as a collector and/or emitter, respectively.

In one or more embodiments firing switch 116 further includes a package for containing and/or protecting the die. In such embodiments, the die is positioned at least partially within the package with the gate pin, collector pin, and emitter pin each having a first end portion extending into the package to provide an electrical connection into the interior of the package and to the die.

In one or more embodiments, the pins each include a second end portion extending outwardly from the package and each having a pin length—defined as the length of the pin from the exterior package to the end the pin. In one or more embodiments, and described further below, the gate pin of the firing switch is positioned adjacent to, at most, one of the collector pin and the emitter pin. As such, in various embodiments, the gate pin will be positioned adjacent to no more than one other pin.

In various embodiments, the positioning of the gate pin as adjacent to no more than one other pin allows for an axial reduction in size of a CDU by allowing for shortened pin lengths for the gate pin, emitter pin, and collector pin, as compared to known firing switch designs. As a result, an axial length L2 of the firing switch 116, in certain embodiments, is no more than 0.6 inches.

In various embodiments the circuit board 118 is a printed circuit board or other device suitable for mechanically and electrically supporting each of the CDU components. As such, in one or more embodiments, the circuit board 118 can include a plurality of mounts capable of receiving each of the CDU components along with one or more integrated electrical connections that are configured to connect one or more of the CDU components together in line with a planned circuit diagram for the detonation device 100, for example as described further below with reference to FIG. 2.

As described above, in various embodiments the circuit board 118 has a generally circular shape with a first side 118.2 and second side 118.4. In such embodiments, one or more of the components of the CDU 104 can be positioned on the first side 118.2 while a remainder of the components can be positioned on the second side 118.4. However, in some embodiments all of the components could be positioned on one of the first side 118.2 or second side 118.4.

In various embodiments, by utilizing both sides of the circuit board 118, the total area required by the circuit board 118 to mount the CDU components can be reduced. Depicted in FIGS. 1C-1D, the firing capacitor 110, trigger circuit 112, and firing switch 116 are positioned on the first side 118.2 while the EFI 114 is positioned on the second side 118.4 of the circuit board 118. However, various suitable combinations of CDU components positioned on the first and second side of the circuit board 118 are possible, described further below with reference to FIGS. 9A-12.

In various embodiments the circuit board 118 has physical dimensions that allow for each of the CDU components to be mounted on the circuit board 118 including an axial length L1, relative to a CDU axis 120, that defines a diameter of the circuit board 118.

As used herein, the CDU axis 120 refers to an axis that runs along two or more adjacent CDU components that together define the width requirements for the printed circuit board 118. For instance, depicted in FIGS. 1C-1D, the firing capacitor 110 and firing switch 116 together define the widest portion of the component layout on the circuit board 118. As such, the CDU axis 120 runs through these components and defines the axial length L1 required to accommodate this ordered arrangement. As a result, the CDU 104 will utilize a circuit board 118 that, in the case of circular board, will have a diameter at least as long as the axial length L1.

As a result, in various embodiments the axial length L1 will depend upon the size and/or the positioning of the CDU components on the circuit board 118. For instance, each of the components will have their own physical space requirements, represented in the high-level view of FIG. 1, along with a physical separation required between each of the components on the circuit board 118 to allow for wiring/electrical connections between components.

Depicted in FIGS. 1C-1D, the firing switch 116 and firing capacitor 110 are positioned on the first side 118.2 of the circuit board 118 in a liner arrangement, axially adjacent to one another along the CDU axis 120. In such embodiments, the axial length L1 is defined by this ordered arrangement of the CDU components along the CDU axis 120.

However, and as a result of specific improvements to the firing switch 116, described further below, the trigger circuit 112 is offset radially from the CDU axis 120 such that the trigger circuit 112 axially overlaps the ordered arrangement of the firing switch 116 and firing capacitor 110. As a result, in such embodiments the trigger circuit 112 does not contribute to the size of the axial length L1 or the circuit board 118. Put another way, in various embodiments the board 118 will be sized only large enough to mechanically and electrically support the components of the CDU 104. By offsetting the trigger circuit 112 off the CDU axis 120, the trigger circuit 112 can be successfully positioned on the board 118 while also not increasing the diameter of the circuit board 118 necessary to accommodate each of the CDU components.

In various embodiments each CDU component has an axial length as measured along the CDU axis 120. As such, and as described above, there is a direct correlation between a component's axial length and the axial length of the CDU 104. As a result, by reducing the size of just one CDU component provides for a more compact CDU 104. Described further below, various embodiments are directed to the firing switch 116 where the firing switch 116 has an axial length L2 that is not more than 35% of the axial length L1 of the CDU 104.

Figure 2:
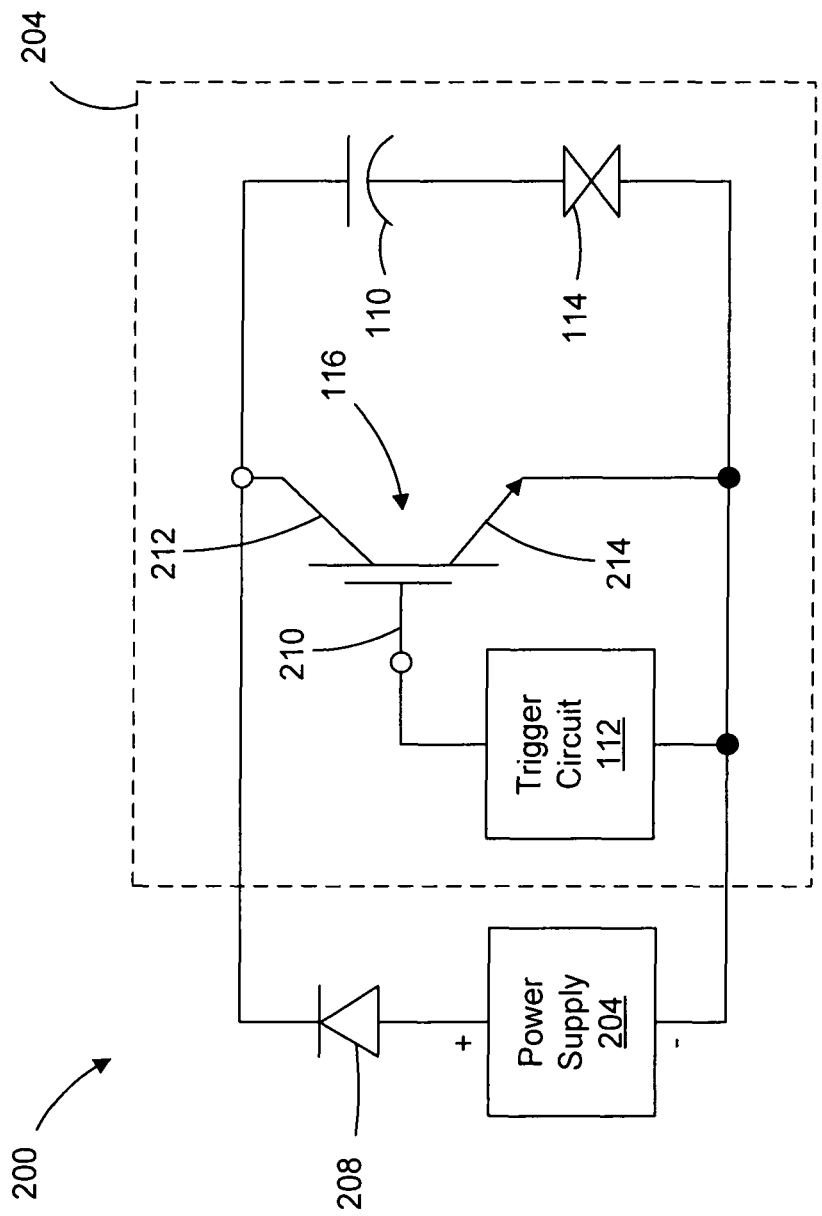
FIG. 2 depicts a circuit diagram of a CDU, according to one or more embodiments of the disclosure.

Referring to FIG. 2, a circuit diagram of a detonation device 200 including a CDU 204 is depicted according to one or more embodiments of the disclosure. In various embodiments the circuit diagram depicts the various electrical arrangement of the CDU 204 including a firing switch 116, a trigger circuit 112, a firing capacitor 110, and an exploding foil initiator (EFI) 114. In various embodiments the detonation device 200 additionally includes a power supply 204, and a rectifier diode 208. As seen in FIG. 2, CDU 204 includes one or more components that are the same or substantially similar to the CDU 104 depicted in FIG. 1. As such, like elements are referenced using like reference numerals.

As described above, in various embodiments the CDU 204 is generally configured to store electricity in the firing capacitor 110 and to release that energy in a burst. In one or more embodiments, and as described above, the firing switch 116 includes a gate pin 210, collector pin 212, and emitter pin 214. In various embodiments, the gate pin 210 is electrically connected with the trigger circuit 112. In one or more embodiments the emitter pin 214 is electrically connected with the EFI 114, trigger circuit 112, and power supply 204. In various embodiments the collector pin 212 is electrically connected with the diode 208 and firing capacitor 110.

In one or more embodiments the firing capacitor 110 is electrically connected with the EFI 114, the collector pin 212 of the firing switch 116, and the diode 208. In one or more embodiments the EFI 114 is electrically connected with the firing capacitor 110, the emitter pin 214 of the firing switch 116, the trigger circuit 112, and the power supply 204. In one or more embodiments the trigger circuit 112 is electrically connected with the gate pin 210 and emitter pin 214 of the firing switch 116, the EFI 114, and the power supply 204.

In operation, the firing switch 116, firing capacitor 110, and EFI 114 form a low inductance loop, where discharge of the firing capacitor 110 is controlled via application of a voltage to the gate pin 210, via the trigger circuit 112, to provide an electrical pathway across the firing switch 116 for discharging stored voltage within the capacitor 110 into the EFI 114. In such embodiments, energy from the firing capacitor 110 causes the metal to explosively vaporize, providing enough force to directly cause an explosive detonation in associated explosive material.

Figure 3A:
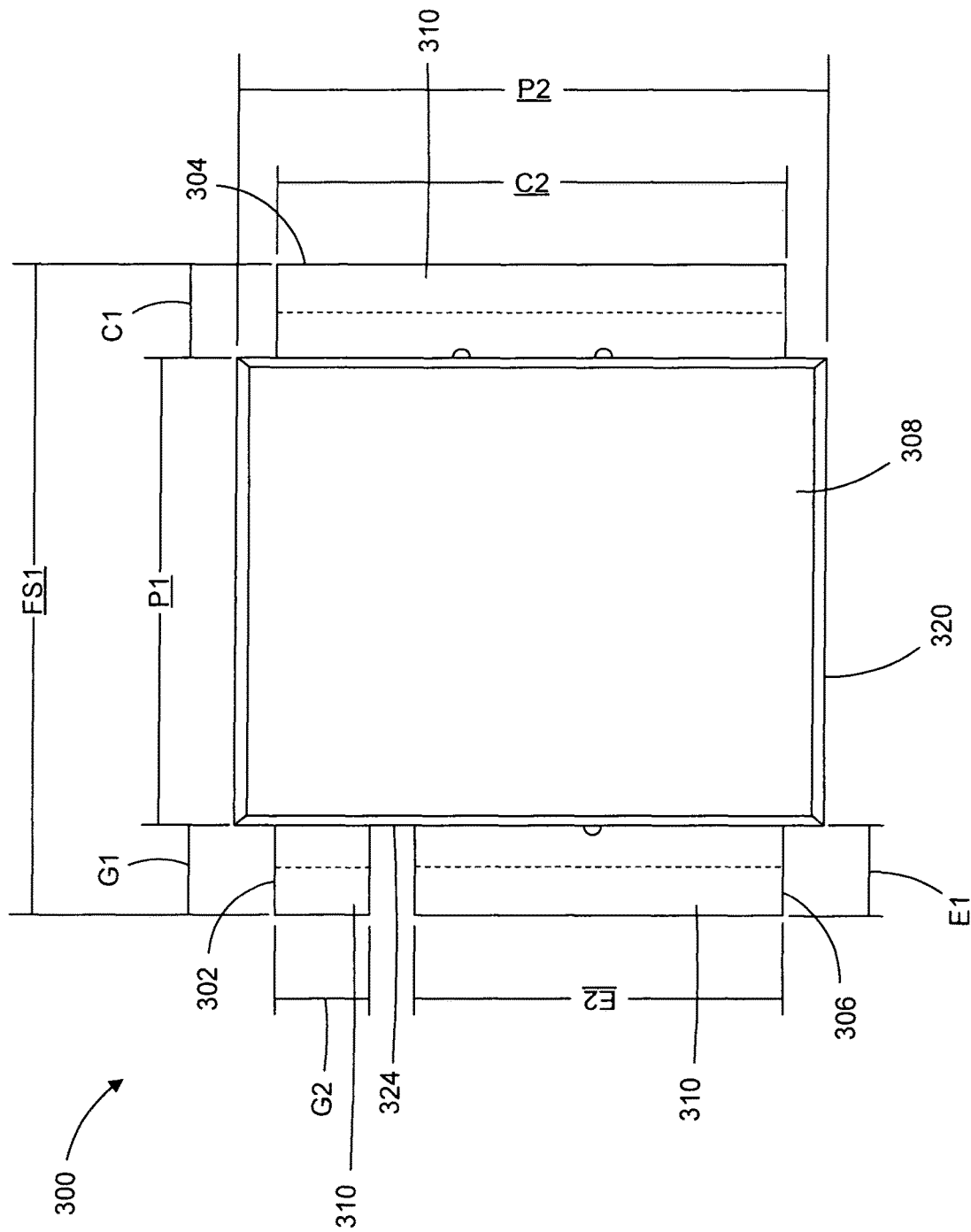
FIG. 3A depicts a top view of an IGBT firing switch according to one or more embodiments of the disclosure.
Figure 3B:
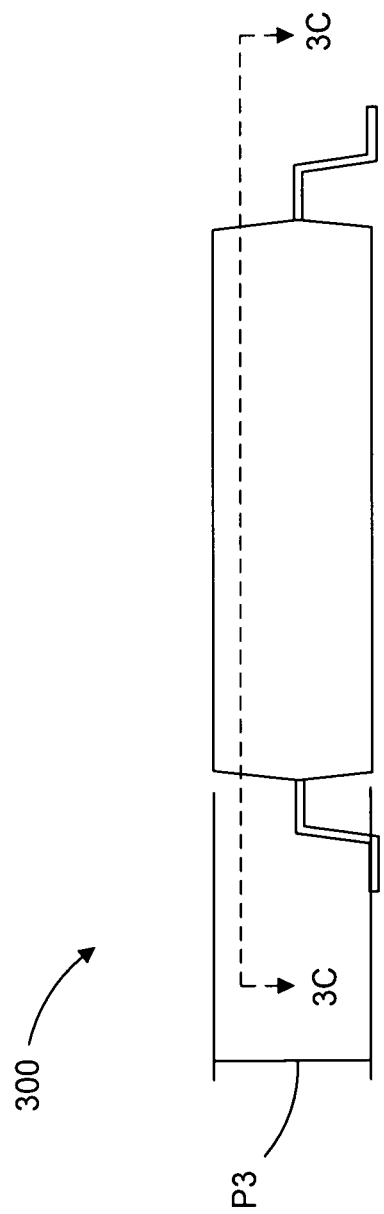
FIG. 3B depicts a side view of another IGBT firing switch according to one or more embodiments of the disclosure.

FIGS. 3A-3B depict top and side views of an IGBT firing switch 300 according to one or more embodiments of the disclosure.

In one or more embodiments the IGBT firing switch 300 includes at least three pins including, but not limited to, a gate pin 302, a collector pin 304, and an emitter pin 306. In addition, and described below with reference to FIGS. 3C-3D, in various embodiments the IGBT firing switch 300 includes an IGBT die including one or more substrate layers and an IGBT chip that includes various circuitry for functioning as a firing switch. In one or more embodiments the IGBT firing switch 300 further includes a package 308 for containing and/or protecting an interior die. In various embodiments the package 308 is constructed from a plastic or other non-conductive material that electrically isolates interior components.

In one or more embodiments, the gate pin 302, collector pin 304, and emitter pin 306 each include one or more individual pins or have an overall pin structure that is composed of one or more pins that are each configured to function for their respective purpose. For example, depicted in FIGS. 3A-3D, the pin structure of the gate pin 302, collector pin 304, and emitter pin 306 is each composed of a single pin, configured respectively to function as a gate, collector, and emitter. In various embodiments, the gate pin 302, collector pin 304, and emitter pin 306 have a first end portion extending into the package 308 to provide an electrical pathway/connection into the interior of the package 308 and to the die, described further below. In various embodiments the gate pin 302, emitter pin 306, and collector pin 304 each include a second end portion 310 extending outwardly from the package and each having a pin length—defined as the length of the pin from the exterior package to the end the pin.

In alternative firing switch designs, described further below, the pin structure of the collector pin 304 and/or emitter pin 306 can be composed of multiple pins where the multiple pins make up the overall structure of the collector and/or emitter for the firing switch. In such instances, the multiple pins of the collector and/or emitter are each configured for respective functioning as a collector/emitter.

Depicted in FIG. 3A, the gate pin 302 has a gate pin length G1, the emitter pin 306 has an emitter pin length E1, and the collector pin 304 has a collector pin length C1.

In various embodiments the pin lengths G1, E1, and C1 can be the same as one another. Alternatively, in certain embodiments, each or some of the pin lengths could be longer or shorter than other pin lengths. Depicted in FIG. 3A, the pin lengths G1, E1, and C1 are substantially the same and have a length of about 0.08 inches. In certain embodiments, and described further below, each of the pins will have a pin length G1, E1, and C1 that does not extend outward axially more than 0.1 inches from a side of the package 308.

In certain embodiments, and depicted in FIG. 3A, the gate pin 302 has a gate pin width G2, the emitter pin 306 has an emitter pin width E2, and the collector pin 304 has a collector pin width C2. In various embodiments the pin widths G2, E2, and C2 can be the same as one another. Alternatively, in certain embodiments, each or some of the pin widths could be longer or shorter than other pin widths. Depicted in FIG. 3A, the pin widths G2, E2, and C2 are different from one another, where pin width G2 has a width of about 0.08 inches, pin width E2 has a width of about 0.3 inches, and pin width C2 has a width of about 0.4 inches. In some embodiments, one or more of the pins are separated from one another in the widthwise axis by a pin space. In various embodiments, the spin space is not less than inches.

In various embodiments, and depicted in FIG. 3A, the package 308, has a pair of lengthwise edges 320 and widthwise edges 324. In one or more embodiments the widthwise edges 320 define a package length P1 and the lengthwise edges define a package width P2. Depicted in FIG. 3B, the package 308 additionally has a package height P3. In such embodiments, the length, width, and height of the package define a general shape and dimensions of the package 308. Generally, in various embodiments the package 308 will be sized just large enough to encompass the die. However, in certain embodiments, the package 308 could be sized larger, for example to encompass additional componentry. Depicted in FIGS. 3A-3B, the package has a length, width, and height P1, P2, P3 that defines a rectangular prism shape. In certain embodiments, the length P1 is not more than 0.5 inches. In certain embodiments the width P2 is not more than 0.60 inches. In some embodiments, the height P3 is not more than 0.2 inches.

In some embodiments, the gate pin 210, collector pin 212, and emitter pin 214 are positioned on different sides of the package 308. For example, in one or more embodiments the gate pin 302 and emitter pin 306 may be located on a first side of the package 308, while the collector pin 304 is located on a second side of the package 308. In various embodiments, and depicted in FIGS. 3A-3D, the first and second sides are opposing sides such that the collector pin 304 is positioned further from the emitter pin 306. In one or more embodiments, the collector pin 304 and emitter pin 306 are separated from one another for improved voltage isolation. For instance, in certain embodiments, the collector pin 304 is positioned not less than 0.2 inches from the emitter pin 306. In such embodiments, there is about a 2000V isolation achieved between the collector pin 304 and emitter pin 306. However, in various embodiments the distance separating the pins can vary, for example based on the size/dimensions of the package 308. In such embodiments the desire for voltage isolation between the pins can be balanced with improvements advantages of a more compact firing switch, as described herein.

In addition to the above, in various embodiments the pin lengths G1, E1, and C1, and package dimensions P1, P2, P3, define a total length FS1 of the firing switch 300, along a lengthwise axis. In various embodiments, the pin length of each of the pins 302, 304, 306 is not more than about 15% of the total length FS1. In one or more embodiments, the pin length of each of the pins 302, 304, 306 of is not more than about 20% of the total length FS1. In various embodiments, each of the pins 302, 304, 306 have a pin length such that they do not extend outward axially more than 0.1 inches from a side of the package 308.

In one or more embodiments, the gate pin 302 is positioned adjacent to, at most, one pin structure of the collector pin 304 or the emitter pin 306. As such, in certain embodiments, the gate pin 302 is always positioned adjacent to one of the lengthwise edges 320 of the package 308. Put another way, in various embodiments the gate pin is not positioned between two or more individual pins of the collector and/or emitter pins 304, 306.

In various embodiments, the positioning of the gate pin 302 as adjacent to no more than one other individual pin allows for an axial reduction in size of a CDU by allowing for shortened pin lengths for the gate pin 302, emitter pin 306, and collector pin 310, as compared to known firing switch designs, described further below. For example, in various embodiments, the axial length FS1 of the IGBT firing switch 300 is no more than 0.6 inches. Described further below, as a result, in certain embodiments the total length FS1 of the IGBT firing switch 300 is not more than 35% of an axial length of a CDU including the firing switch 300.

Figure 3C:
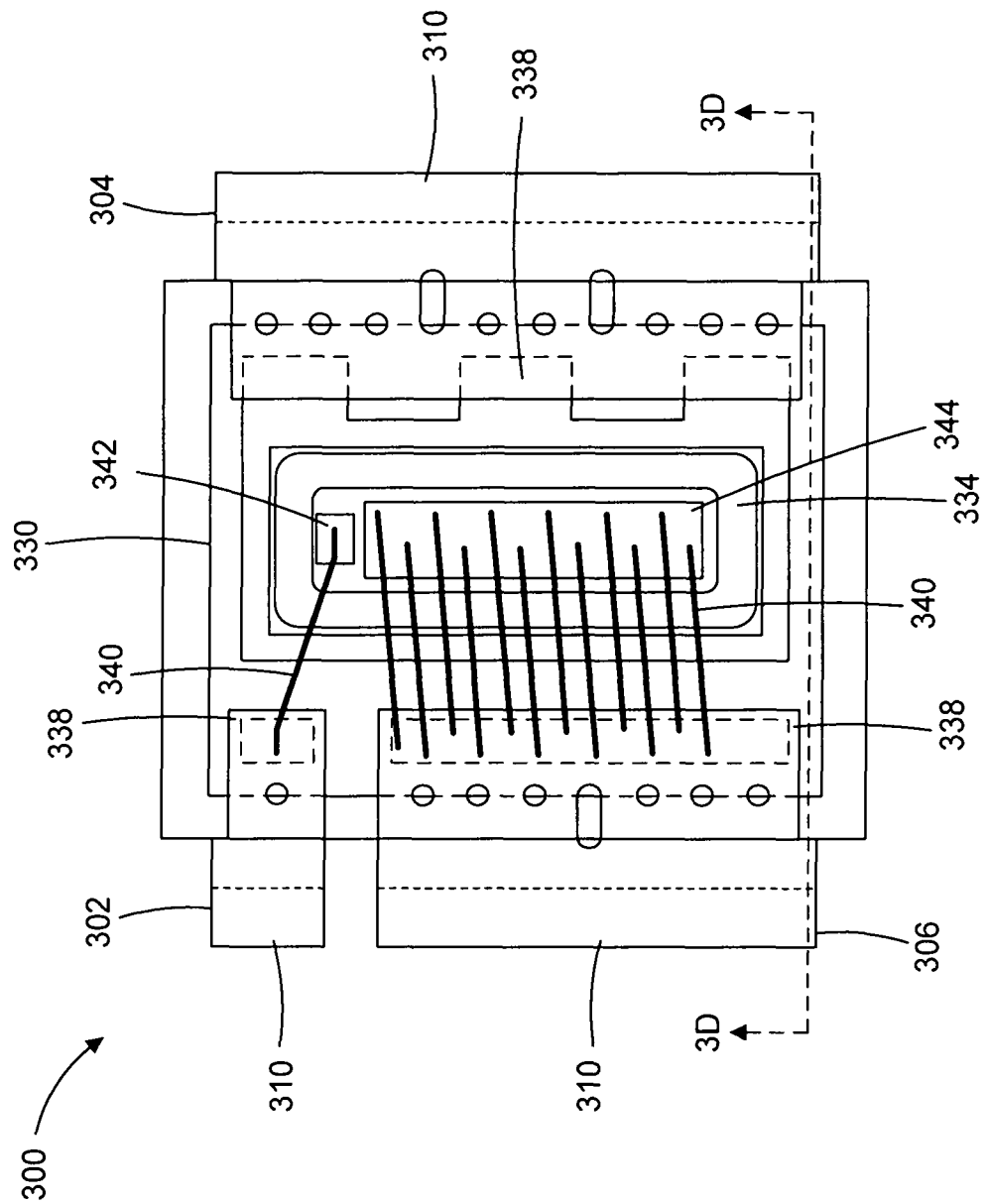
FIG. 3C depicts a partial cross-sectional view of an IGBT firing switch taken at line 3C-3C of FIG. 3B, according to one or more embodiments of the disclosure.
Figure 3D:
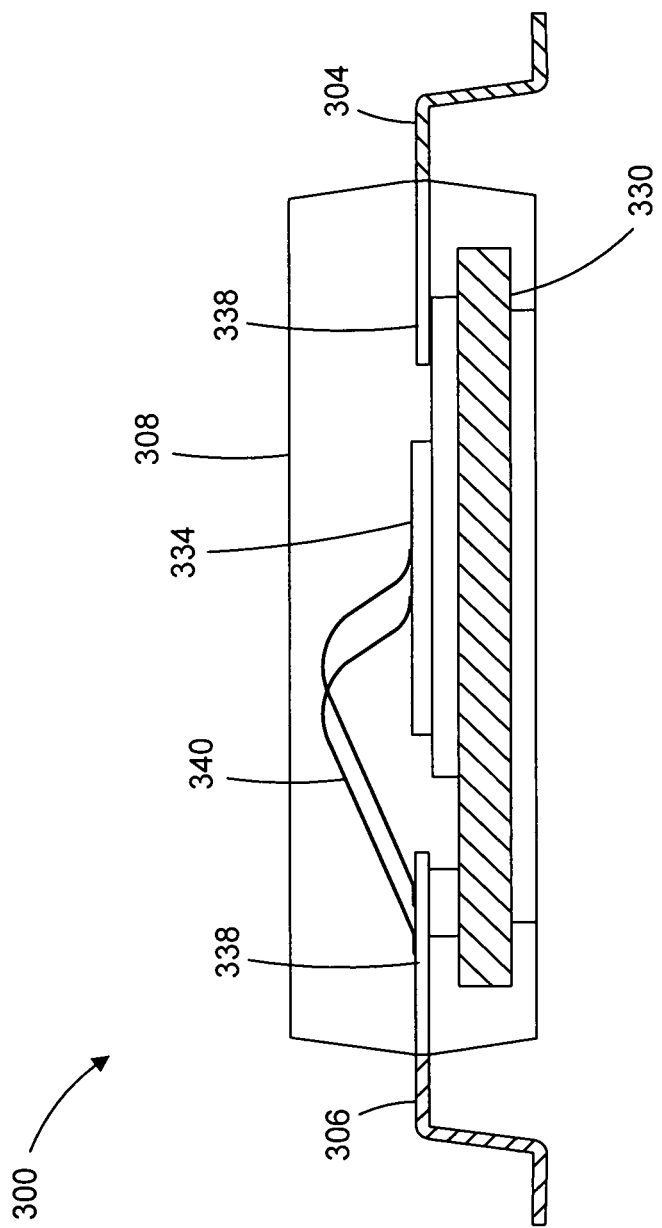
FIG. 3D depicts a partial cross-sectional view of an IGBT firing switch taken at line 3D-3D of FIG. 3C, according to one or more embodiments of the disclosure.

FIGS. 3C-3D depict partial cross-sectional views of the IGBT firing switch 300, according to one or more embodiments of the disclosure. Specifically, FIG. 3C depicts a partial cross-sectional view taken at line 3C-3C of FIG. 3B and FIG. 3D depicts a partial cross-sectional view taken at line 3D-3D of FIG. 3C.

As described above, in various embodiments the package 308 encapsulates a die 330 including one or more substrate layers and an IGBT chip 334. In various embodiments, the gate pin 302, collector pin 304, and emitter pin 306 have a first end portion 338 extending into the package 308 to provide an electrical pathway/connection into the interior of the package 308 and to the die, described further below. In various embodiments the gate pin 302, emitter pin 306, and collector pin 304 each include a second end portion 310 extending outwardly from the package 308.

In one or more embodiments the die 330 is electrically connected with the gate pin 302 and the emitter pin 306 via one or more bonding wires 340. Specifically, in certain embodiments, the gate pin 302 is electrically connected to a first chip portion 342 of the IGBT chip 334 and the emitter pin 306 is electrically connected to a second chip portion 344 of the IGBT chip 334. In embodiments, the bonding wire 340 is aluminum wire. In some embodiments, the bonding wire is about 0.2 inches in diameter. In some embodiments, at least eleven bonding wires 340 electrically connect the emitter pin 306 to the IGBT chip 334. In various embodiments, the collector pin 304 is directly connected to the die 330. In embodiments, one or more substrate layers of the die 330 is a direct copper bonded (DCB) alumina.

Figure 4A:
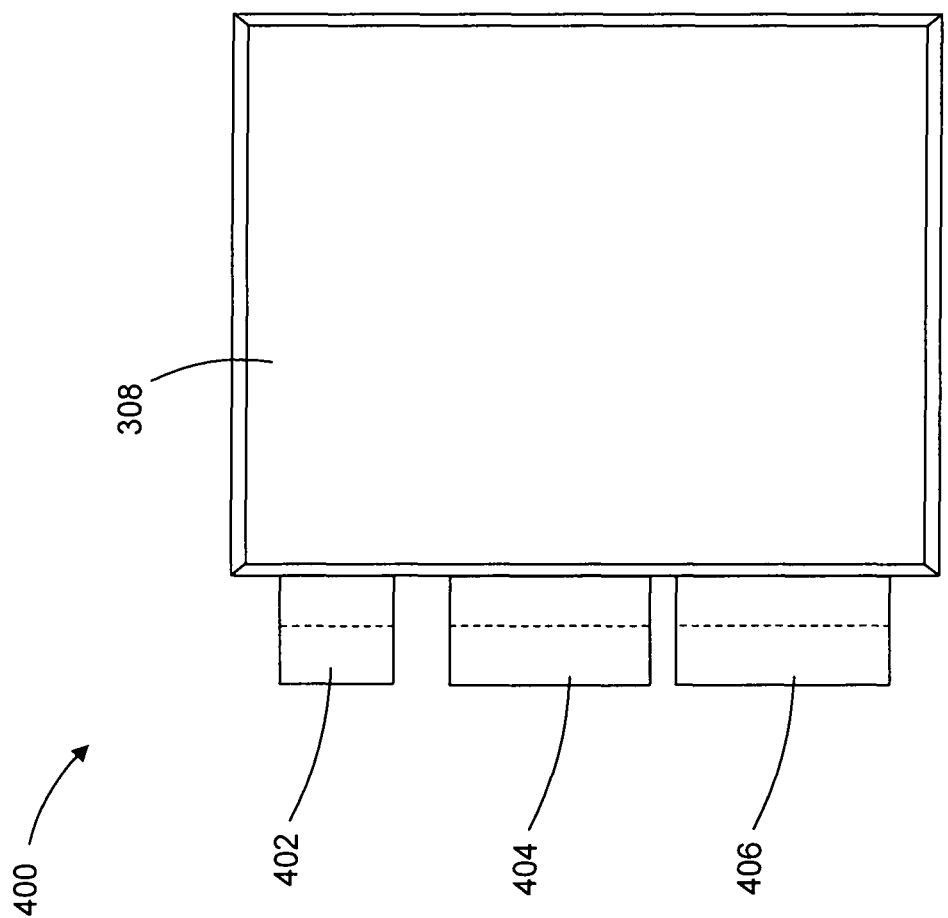

FIGS. 4A-4B depict alternative designs for an IGBT firing switch, according to one or more embodiments of the disclosure. Referring specifically to FIG. 4A, in one or more embodiments the IGBT firing switch 400 includes a package 308 with at least three pins including, but not limited to, a gate pin 402, a collector pin 404, and an emitter pin 406. As described above, the gate pin 402, collector pin 404, and emitter pin 406 each include one or more individual pins or have an overall pin structure that is composed of one or more pins configured to function for their respective purpose.

For example, depicted in FIG. 4A, the pin structure of the gate pin 402, collector pin 404, and emitter pin 406 is each composed of a single pin each positioned on a single side of the package 308 and, configured respectively to function as a gate, collector, and emitter. In various embodiments, the gate pin 402, collector pin 404, and emitter pin 404 have a first end portion extending into the package 308 to provide an electrical pathway/connection into the interior of the package 308 and to a die positioned within the package 308.

In one or more embodiments, the gate pin 402 is positioned adjacent to, at most, one pin structure of the collector pin 404 or the emitter pin 406. As such, in certain embodiments, the gate pin 402 is always positioned adjacent to one of the lengthwise edges of the package 308. Put another way, in various embodiments the gate pin is not positioned between two or more pin structures of the collector and/or emitter pins.

Referring to FIG. 4B, in one or more embodiments the IGBT firing switch 420 includes a package 308 with at least three pins including, but not limited to, a gate pin 422, a collector pin 424, and an emitter pin 426. As described above, the gate pin 422, collector pin 424, and emitter pin 426 each include one or more individual pins or have an overall pin structure that is composed of one or more pins configured to function for their respective purpose.

For example, depicted in FIG. 4B, the pin structure of the collector pin 424 and emitter pin 426 is each composed of a plurality of pins and configured respectively to function as a collector or emitter. In such embodiments, each pin of the collector pin and emitter pin 426 have a first end portion extending into the package 308 to provide an electrical pathway/connection into the interior of the package 308 and to a die positioned within the package 308.

As with previous embodiments, the gate pin 422 in FIG. 4B is positioned adjacent to, at most, one individual pin of the collector pin 424 or the emitter pin 426. As such, in certain embodiments, the gate pin 422 is always positioned adjacent to one of the edges of the package 308. Put another way, in various embodiments the gate pin is not positioned between two or more individual pins of the collector and/or emitter pins.

Figure 5:
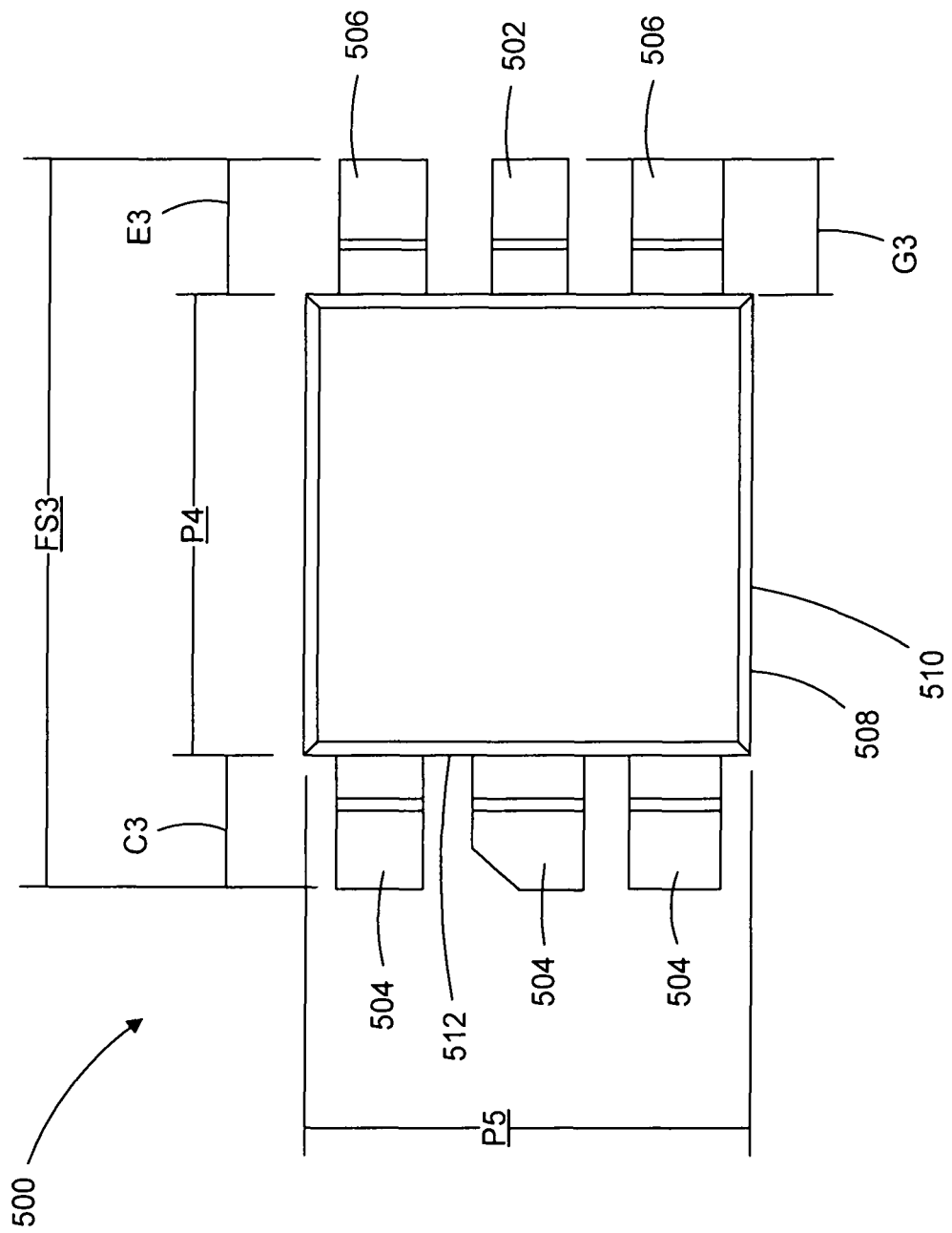
FIG. 5 depicts a known design for an IGBT firing switch.

FIG. 5 depicts an alternative design for an IGBT firing switch 500. The IGBT firing switch 500 includes a gate pin 502, a collector pin 504, and an emitter pin 506 and a package 508 with an IGBT die positioned within the package 508.

The gate pin 502, collector pin 504, and emitter pin 506 each have an overall pin structure that is composed of one or more pins configured to function for their respective purpose. For example, depicted in FIG. 5, the collector pin 504 and emitter pin 506 is each composed of a plurality of pins and configured respectively to function as a collector or emitter. For instance, the collector pin 504 includes three individual pins positioned on a first side of the package 508 and the emitter pin 506 includes two individual pins positioned on a second side of the package 508.

Depicted in FIG. 5, the gate pin 502 has a gate pin length G3, the emitter pin 506 has an emitter pin length E3, and the collector pin 504 has a collector pin length C3. Depicted in FIG. 5, the pin length G3 has a length of about 0.16 inches. The pin length E3 has a length of about 0.16 inches. The pin length C3 has a length of about 0.16 inches.

The gate pin 502 has a gate pin width G4, the emitter pin 506 has an emitter pin width E4, and the collector pin 504 has a collector pin width C4. Depicted in FIG. 5, the pin widths G4, E4, and C4 are about 0.085 inches, 0.1 inches, and 0.13 inches, respectively.

The package 508 has a pair of lengthwise edges 510 and widthwise edges 512. The lengthwise edges 510 define a package length P4 and the widthwise edges define a package width P5. In various instances the length P4 is about 0.5 inches and the width P5 is about 0.5 inches.

In addition to the above, the pin lengths G3, E3, and C3, and package dimensions P4, P5 define the total length FS3 of the firing switch 500. In various embodiments the total length FS3 is about 0.85 inches. Depicted in FIG. 5, the pin length of each of the pins 502, 504, 506 is about 19% of the total length FS3.

Depicted in FIG. 5, the gate pin 502 is positioned adjacent to two individual pins of the emitter pin 506. Put another way, the gate pin 502 of firing switch 500 is positioned between two or more individual pins of the emitter pin 506. As such, the positioning of the gate pin as between two individual pins provides for an increased size of a CDU by requiring longer pin lengths for various circuitry to connect to the gate pin 502 while also avoiding both pins of the emitter pin 506. Described further below, as a result, the total length FS3 of the IGBT firing switch 500 is nearly 35% or more of an axial length of a CDU including the firing switch 500.

Figure 6:
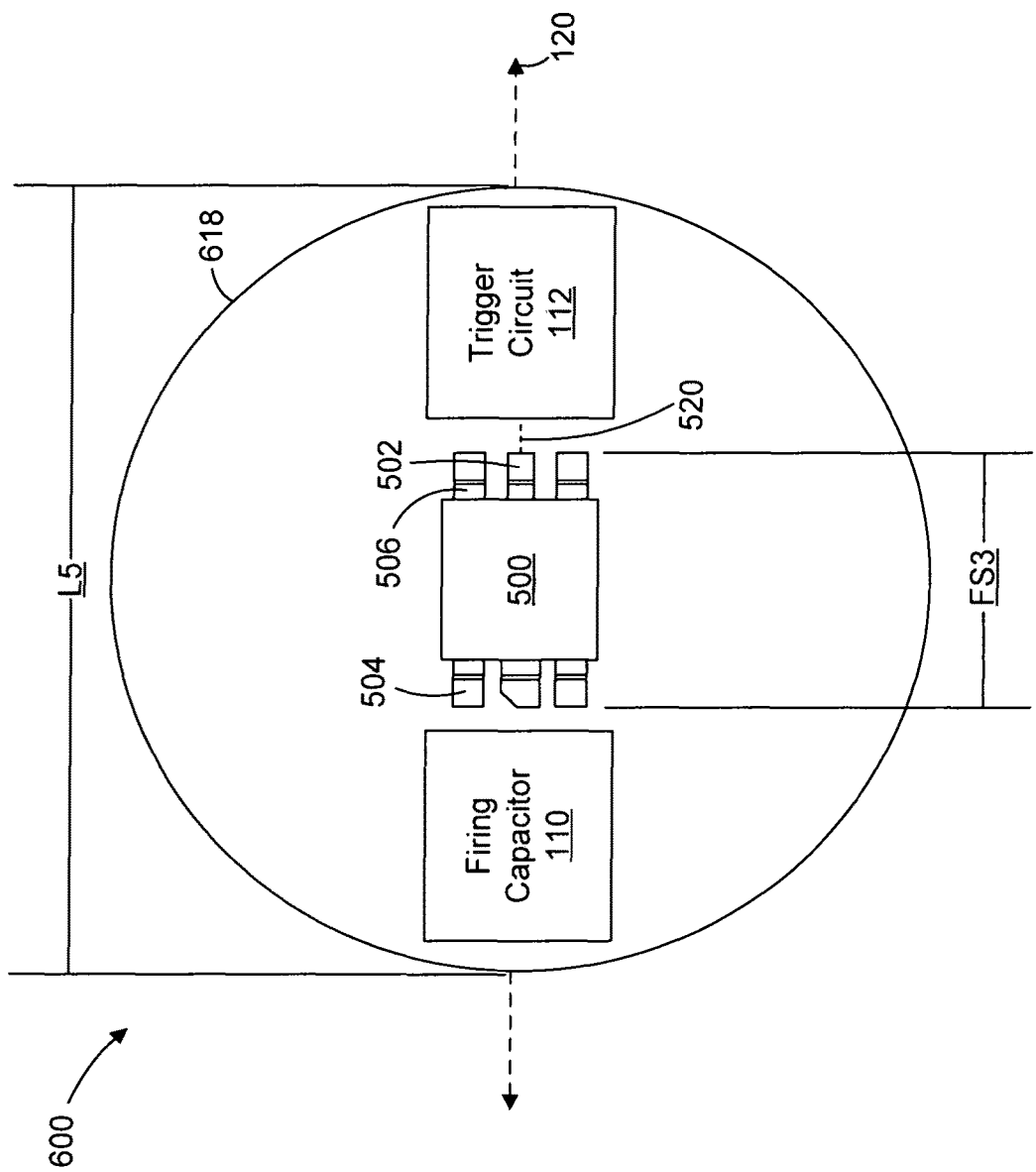
FIG. 6 depicts a CDU including the known design for an IGBT firing switch as depicted in FIG. 5.

FIG. 6 depicts a CDU 600 including the alternative design for an IGBT firing switch 500 as depicted in FIG. 5. The CDU 100 includes a firing capacitor 110, a trigger circuit 112, and the IGBT firing switch 500. Each of the CDU components are mounted on a shared circuit board 618. An exploding foil initiator (EFI) (not pictured) is positioned on an opposing side of the circuit board 618.

Depicted in FIG. 6, the firing capacitor 110 and trigger circuit 112 are represented in a high-level view that depicts the relative positions of the components on the board 618 while the IGBT firing switch 500 is shown with structural detail as described above with reference to FIG. 5. For instance, IGBT firing switch 500 includes a plurality of pins including a gate pin 502, emitter pin 506 and collector pin 504.

FIG. 6 depicts the CDU components and the relative area/space on the shared circuit board 618 that each component occupies. For example, the IGBT firing switch 500 has a total axial length FS3 along a CDU axis 120 in relation to a total CDU axial length L3. In various embodiments the total axial length FS3 is about 0.85 inches.

As described above, the positioning of the gate pin as between two individual pins provides for an increased size of a CDU 600 by requiring longer pin lengths for various circuitry to connect to the gate pin while also avoiding both pins of the emitter pin. As a result, trigger circuitry 112 is required to be placed along the CDU axis 120 with the IGBT firing switch 500 and firing capacitor 110 to form a electrical connection 520 between the two components. In such instances the trigger circuit 112 contributes to the size of the axial length L5 of the circuit board 618.

As a result, the total length FS3 of the IGBT firing switch 600 is nearly 35% or more of an axial length of a CDU including the firing switch 500.

Figure 7:
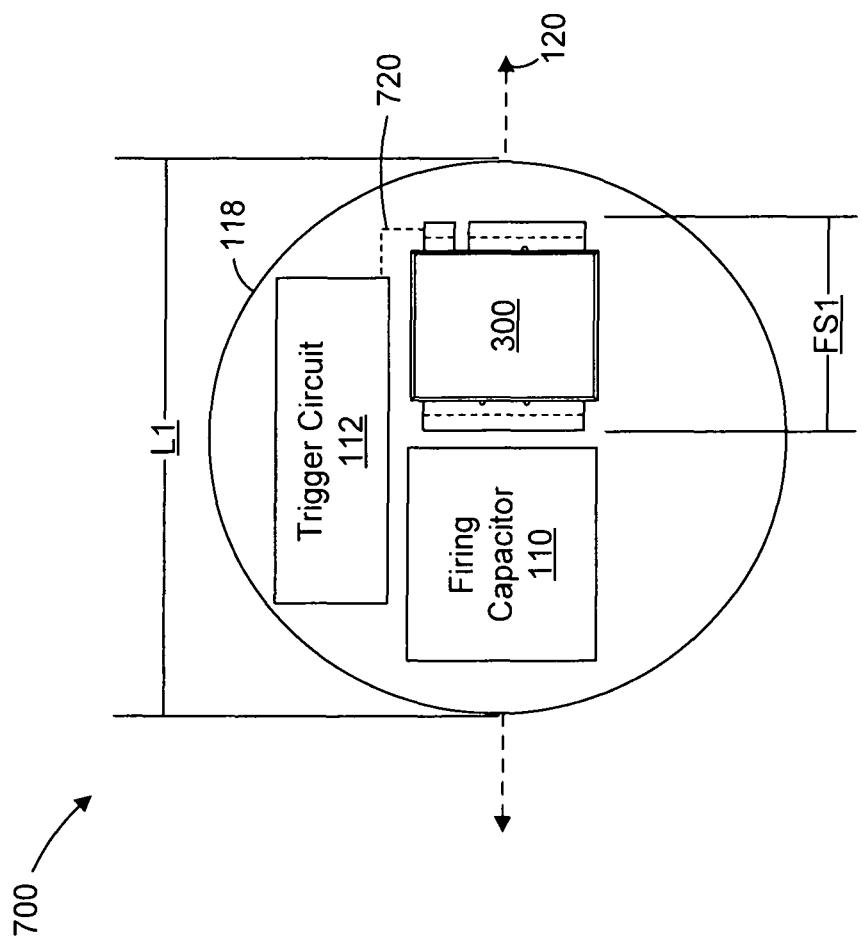
FIG. 7 depicts a CDU including the IGBT firing switch as depicted in FIGS. 3A-3D, according to one or more embodiments of the disclosure.

In comparison, referring to FIG. 7, a high-level view of a CDU 700 is depicted, according to one or more embodiments of the disclosure. Specifically, FIG. 7 depicts a CDU 700 including an IGBT firing switch 300 as depicted and described above with reference to FIGS. 3A-3D.

In various embodiments the CDU 700 includes one or more components including, but not limited to, a firing capacitor 110, a trigger circuit 112, and a firing switch 300. In such embodiments, each of the CDU components are mounted on a shared circuit board 718. An EFI 114 is positioned on an opposing side of the circuit board 718, as described above with reference to FIG. 1D.

FIG. 7 depicts the CDU components and the relative area/space on the shared circuit board 718 that each component occupies. For example, the IGBT firing switch 300 has a total axial length FS1 along a CDU axis 120 in relation to a total CDU axial length L5

As described above, the firing switch 300 has a total length FS1 defined by the length of its pins and/or the size of the package. In various embodiments, the pin length of each of the pins is not more than about 15% of the total length FS1. In one or more embodiments, the pin length of each of the pins is not more than about 20% of the total length FS1. In various embodiments, each of the pins have a pin length such that they do not extend outward axially more than 0.1 inches from a side of the package.

In one or more embodiments, the gate pin is positioned adjacent to, at most, one pin structure of the collector pin or the emitter pin. The positioning of the gate pin as adjacent to no more than one other pin structure allows for an axial reduction in size of a CDU 700 by allowing for axial offset of one or components from the CDU axis 120.

As a result, components of the CDU 700 can be more closely placed together. For example, the trigger circuit 112 is axially offset such that the trigger circuit 112 does not contribute to the size of the axial length L1 or the circuit board 118. In addition, an electrical connection 720 can be made between the firing switch 300 without interfering with the emitter pins. In addition, the positioning of the gate pin also allows for shortened pin lengths for the gate pin, emitter pin, and collector pin, as compared to known firing switch designs. In certain embodiments the total length FS1 of the IGBT firing switch 300 is not more than 35% of an axial length of a CDU including the firing switch 300.

As a result, various embodiments provide a CDU 700 having a total length L5 along a CDU axis 120 that is 35% of the axial length of the CDU 600 depicted in FIG. 6.

Figure 8:
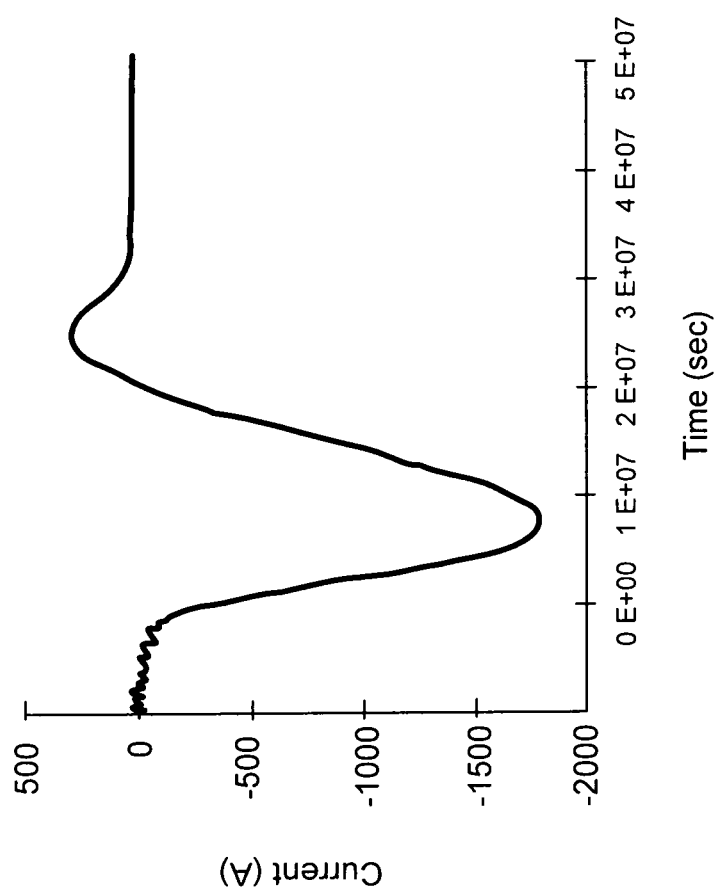
FIG. 8 depicts a graphical view of the electrical characteristics of an IGBT firing switch according to one or more embodiments of the disclosure.

FIG. 8 depicts a graphical view of the electrical characteristics of an IGBT firing switch according to one or more embodiments of the disclosure. In various embodiments, and depicted in FIG. 8, the IGBT firing switch can provide about 2000 Amperes in about a 100 nanosecond rate of rise into about a 0.25 ohm load. This rate of change of current is sufficient to impart EFI detonation. In addition, the IGBT firing switch is capable of pulsing many times without degradation. This lack of degradation permits the CDU to be thoroughly tested prior to deployment.

The IGBT firing switch has low leakage current under a high voltage bias. Additionally, the IGBT firing switch has a low jitter, allowing the CDU to be used for shaping in multi-point warhead initiation systems. The zero volt hold odd of the IGBT firing switch assists in preventing early bursts of the firing capacitor.

Referring to FIGS. 9A-9B high-level views of a CDU 900 are depicted, according to one or more embodiments of the disclosure. In various embodiments, CDU 900 shares the same or substantially similar components to CDU 104 depicted above with reference to FIGS. 1C-1D. As such, CDU 900 includes various CDU components including a firing capacitor 110, trigger circuit 112, EFI 114, firing switch 116, and circuit board 918.

As described above, the circuit board 918 is a printed circuit board or other device suitable for mechanically and electrically supporting each of the CDU components. As such, in one or more embodiments, the circuit board 918 can include a plurality of mounts capable of receiving each of the CDU components along with one or more integrated electrical connections that are configured to connect one or more of the CDU components together in line with a planned circuit diagram for the detonation device 100.

As described above, in various embodiments the circuit board 918 has a generally circular shape with a first side 918.2 and second side 918.4. In such embodiments, one or more of the components of the CDU 104 can be positioned on the first side 918.2 while a remainder of the components can be positioned on the second side 918.4. However, in some embodiments all of the components could be positioned on one of the first side 918.2 or second side 918.4.

In various embodiments, by utilizing both sides of the circuit board 918, the total area required by the circuit board 918 to mount the CDU components can be reduced. Depicted in FIGS. 9A-9B, the trigger circuit 112 and firing switch 116 are positioned on the first side 918.2 while the EFI 114 and firing capacitor 110 are positioned on the second side 918.4 of the circuit board 918.

In various embodiments the circuit board 918 has physical dimensions that allow for each of the CDU components to be mounted on the circuit board 918 including an axial length L9, relative to a CDU axis 120, that defines a diameter of the circuit board 918.

Figures 10A, 10B:
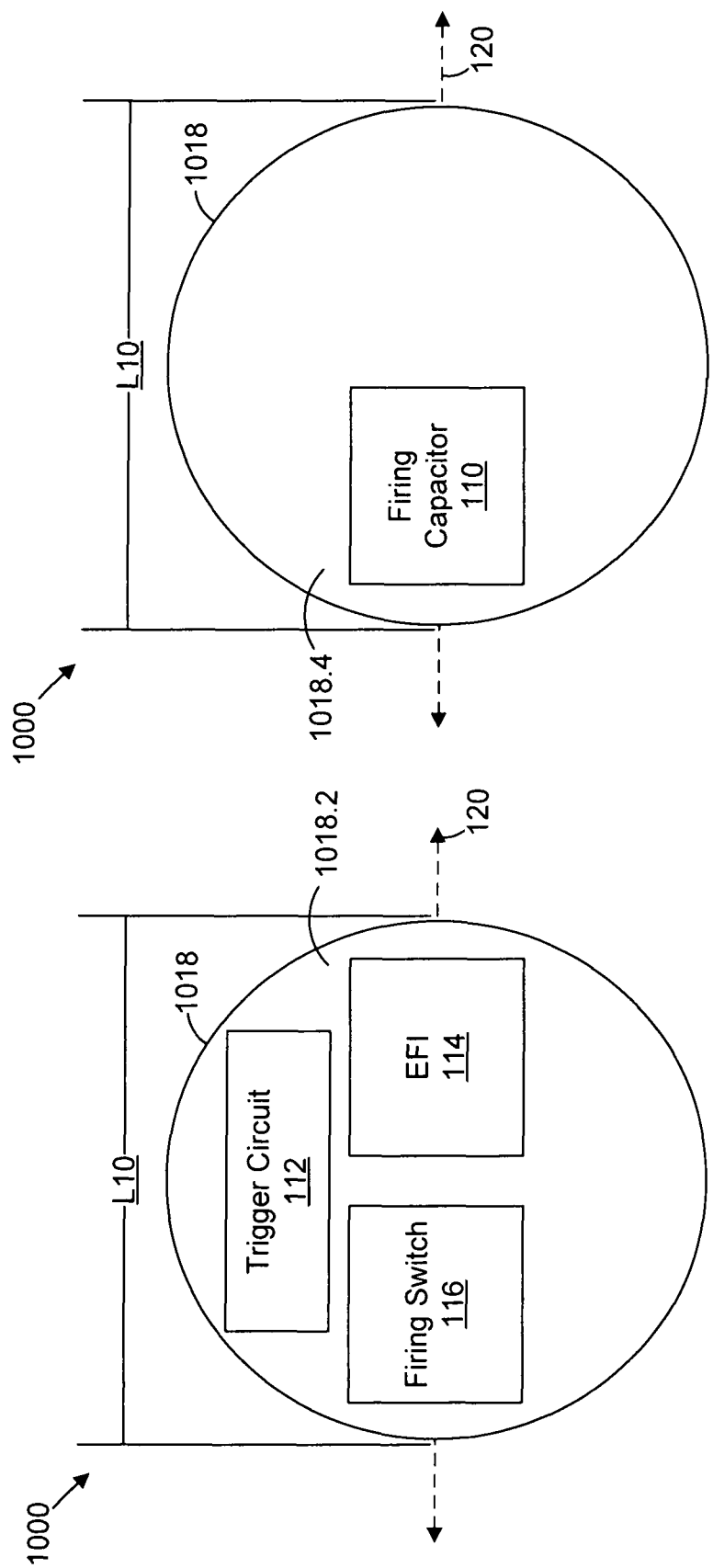
FIGS. 10A-10B depict high-level views of a CDU, according to one or more embodiments of the disclosure.

Referring to FIGS. 10A-10B high-level views of a CDU 1000 are depicted, according to one or more embodiments of the disclosure. In various embodiments, CDU 1000 shares the same or substantially similar components to CDU 104 depicted above with reference to FIGS. 1C-1D. As such, CDU 1000 includes various CDU components including a firing capacitor 110, trigger circuit 112, EFI 114, firing switch 116, and circuit board 1018.

As described above, the circuit board 1018 is a printed circuit board or other device suitable for mechanically and electrically supporting each of the CDU components. As such, in one or more embodiments, the circuit board 1018 can include a plurality of mounts capable of receiving each of the CDU components along with one or more integrated electrical connections that are configured to connect one or more of the CDU components together in line with a planned circuit diagram for the detonation device 100.

As described above, in various embodiments the circuit board 1018 has a generally circular shape with a first side 1018.2 and second side 1018.4. In such embodiments, one or more of the components of the CDU 104 can be positioned on the first side 1018.2 while a remainder of the components can be positioned on the second side 1018.4. However, in some embodiments all of the components could be positioned on one of the first side 1018.2 or second side 1018.4.

In various embodiments, by utilizing both sides of the circuit board 1018, the total area required by the circuit board 1018 to mount the CDU components can be reduced. Depicted in FIGS. the trigger circuit 112, firing switch 116, and EFI 114 are positioned on the first side 1018.2 while the firing capacitor 110 is positioned on the second side 1018.4 of the circuit board 1018.

In various embodiments the circuit board 1018 has physical dimensions that allow for each of the CDU components to be mounted on the circuit board 1018 including an axial length L10, relative to a CDU axis 120, that defines a diameter of the circuit board 1018.

Referring to FIGS. 11A-11B, high-level views of a CDU 1100 are depicted, according to one or more embodiments of the disclosure. In various embodiments, CDU 1100 shares the same or substantially similar components to CDU 104 depicted above with reference to FIGS. 1C-1D. As such, CDU 1100 includes various CDU components including a firing capacitor 110, trigger circuit 112, EFI 114, firing switch 116, and circuit board 1118.

As described above, the circuit board 1118 is a printed circuit board or other device suitable for mechanically and electrically supporting each of the CDU components. As such, in one or more embodiments, the circuit board 1118 can include a plurality of mounts capable of receiving each of the CDU components along with one or more integrated electrical connections that are configured to connect one or more of the CDU components together in line with a planned circuit diagram for the detonation device 100.

As described above, in various embodiments the circuit board 1118 has a generally circular shape with a first side 1118.2 and second side 1118.4. In such embodiments, one or more of the components of the CDU 104 can be positioned on the first side 1118.2 while a remainder of the components can be positioned on the second side 1118.4. However, in some embodiments all of the components could be positioned on one of the first side 1118.2 or second side 1118.4.

In various embodiments, by utilizing both sides of the circuit board 1118, the total area required by the circuit board 1118 to mount the CDU components can be reduced. Depicted in FIGS. 11A-11B, the trigger circuit 112, firing capacitor 110, and EFI 114 are positioned on the first side 1118.2 while the firing switch 116 is positioned on the second side 1118.4 of the circuit board 1118.

In various embodiments the circuit board 1118 has physical dimensions that allow for each of the CDU components to be mounted on the circuit board 1118 including an axial length L11, relative to a CDU axis 120, that defines a diameter of the circuit board 1118.

Figure 12:
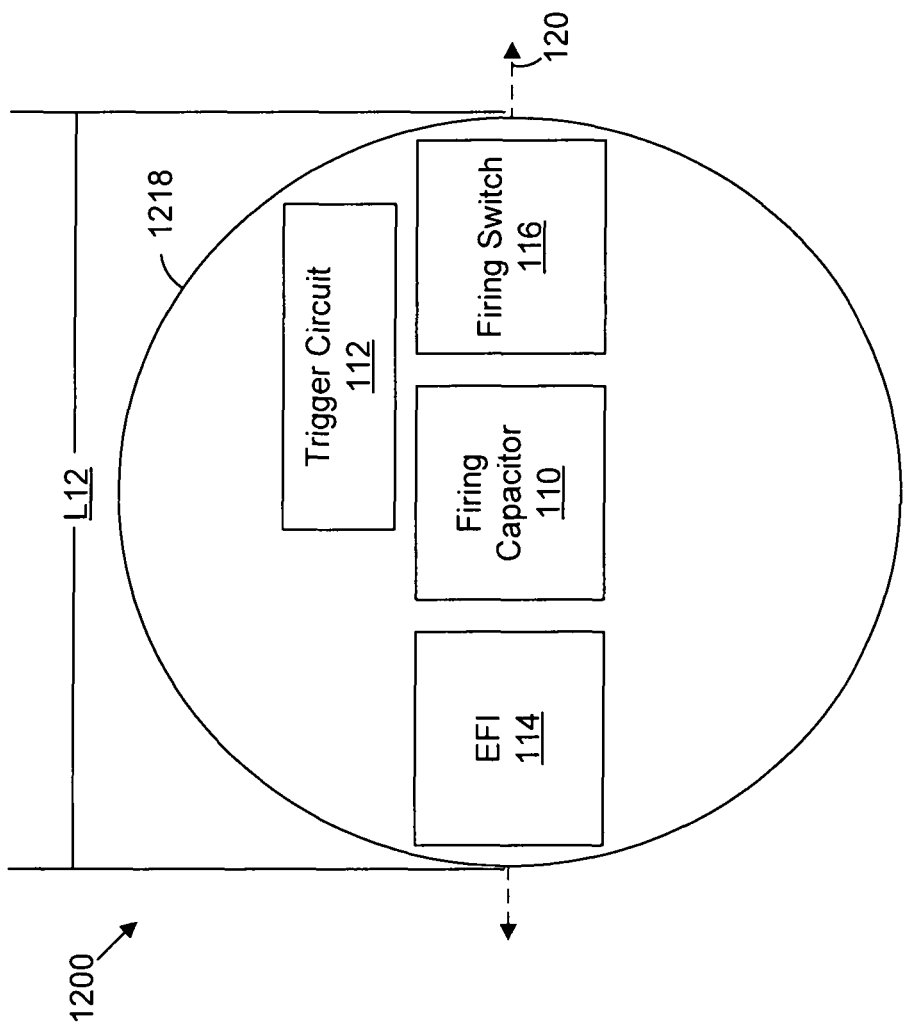
FIG. 12 depicts a high-level view of a CDU, according to one or more embodiments of the disclosure.

Referring to FIG. 12 a high-level view of a CDU 1200 is depicted, according to one or more embodiments of the disclosure. In various embodiments, CDU 1200 shares the same or substantially similar components to CDU 104 depicted above with reference to FIGS. 1C-1D. As such, CDU 1200 includes various CDU components including a firing capacitor 110, trigger circuit 112, EFI 114, firing switch 116, and circuit board 1118.

As described above, the circuit board 1118 is a printed circuit board or other device suitable for mechanically and electrically supporting each of the CDU components. As such, in one or more embodiments, the circuit board 1118 can include a plurality of mounts capable of receiving each of the CDU components along with one or more integrated electrical connections that are configured to connect one or more of the CDU components together in line with a planned circuit diagram for the detonation device 100.

As described above, in various embodiments the circuit board 1118 has a generally circular shape Depicted in FIGS. 11A-11B, the trigger circuit 112, firing capacitor 110, and EFI 114 are positioned on a single side of the circuit board 1218. In various embodiments the circuit board 1218 has physical dimensions that allow for each of the CDU components to be mounted on the circuit board 1218 including an axial length L12, relative to a CDU axis 120, that defines a diameter of the circuit board 1218.

For purposes of this disclosure, some measurements are described as being "about" a certain number. When a measure in this disclosure is describe as being "about" a certain number, it is intended that an embodiment may fall within a range that is 10% larger or smaller than the actual measurement provided in this disclosure.

Additional disclosure on CDUs and detonation components can be found in U.S. Pat. Nos. 6,138,517; 6,389,975; 6,404,065; 6,476,481; 6,634,298; 6,966,261; 7,199,461; 7,236,345; 8,091,477; 9,013,154; 9,041,172; 9,115,970; and 9,824,996. These references are incorporated by reference herein for all purposes.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A capacitive discharge unit (CDU) for detonating an explosive in response to a control signal, the CDU comprising:
    an exploding foil initiator (EFI); a trigger circuit;
    a firing capacitor; and
    an insulated-gate bipolar transistor (IGBT) firing switch, the IGBT firing switch including:
        a die encased in a package, the die having an IGBT chip; and
        a gate pin, a collector pin, and an emitter pin, the collector pin and emitter pin each including one or more individual pins having a first end portion electrically connected to the die and an opposite end portion extending outward from the package, and the collector pin having a first end electrically connected to one or more substrate layers of the die and an opposite end extending outward from the package, wherein the gate pin is positioned adjacent to, at most, one of the collector pin and the emitter pin, and wherein the collector and emitter pins are positioned on opposing sides of the package; and
    a board for mechanically and electrically supporting the trigger circuit, the EFI, the firing capacitor, and the IGBT firing switch, the CDU having an axial length defined by an ordered arrangement along a CDU axis of two or more of the EFI, the firing capacitor, and the IGBT firing switch, wherein the trigger circuit is offset from the CDU axis such that the trigger circuit does not contribute to the axial length;
    wherein an axial length of the IGBT firing switch is not more than 35% of the axial length of the CDU.

2. The CDU of claim 1, wherein the axial length of the IGBT firing switch is not more than 0.6 inches.

3. The CDU of claim 2, wherein an axial length of the package is not more than 35% of the axial length of the CDU.

4. The CDU of claim 2, wherein an axial length of each of the collector pin, emitter pin, and gate pin is not more than 35% of the axial length of the CDU.

5. The CDU of claim 1, wherein the firing capacitor has a capacitance of about 0.15 μF and is capable of being charged to about 1000 V.

6. The CDU of claim 1, wherein the gate pin of the IGBT firing switch is electrically connected to the trigger circuit.

7. The CDU of claim 1, wherein the emitter pin of the IGBT firing switch is electrically connected to the EFI and the trigger circuit.

8. The CDU of claim 1, wherein the collector pin of the IGBT firing switch is electrically connected to the firing capacitor.

9. The CDU of claim 1, wherein the IGBT firing switch is configured to provide about 2000 A in a 100 ns rate of rise into a 0.25 ohm load.

10. The CDU of claim 1, wherein the EFI is a low-energy exploding foil initiator (LEEFI).

11. The CDU of claim 1, wherein the CDU is potted.

12. A capacitive discharge unit (CDU) for detonating an explosive in response to a control signal, the capacitive discharge unit comprising:
    a plurality of CDU components including:
        an exploding foil initiator (EFI);
        a trigger circuit;
        a firing capacitor; and
        an insulated-gate bipolar transistor IGBT firing switch; and
    a board for mechanically and electrically supporting the trigger circuit, the EFI, the firing capacitor, and the IGBT firing switch, the CDU having an axial length defined by an ordered arrangement along a CDU axis of two or more of the EFI, the firing capacitor, and the IGBT firing switch, wherein the trigger circuit is mounted on the board and laterally offset from the CDU axis such that the trigger circuit does not contribute to the axial length;
    wherein the axial length of the CDU comprises a first linear portion including the IGBT firing switch and a second linear portion including a remainder of the plurality of CDU components in the ordered arrangement, and wherein the first linear portion has an axial length that is not more than 35% of the axial length of the CDU.

13. The CDU of claim 12, wherein the IGBT firing switch comprises: a die encased in a package, the die having an IGBT chip; and
    a gate pin, a collector pin, and an emitter pin, the collector pin and emitter pin each including one or more individual pins having a first end portion electrically connected to the die and an opposite end portion extending outward from the package, and the collector pin having a first end electrically connected to one or more substrate layers of the die and an opposite end extending outward from the package, wherein the gate pin is positioned adjacent to, at most, one of the collector pin and the emitter pin.

14. The CDU of claim 12, wherein the second linear portion has an axial length that is no less than 65% of the axial length of the CDU.

15. The CDU of claim 12, wherein an axial length of the second linear portion is a combined axial length of the EFI and the firing capacitor, and the trigger circuit.

16. The CDU of claim 12, wherein the axial length of the first linear portion is not more than 0.6 inches.

17. A munition comprising:
  a chassis containing a payload having a quantity of explosive material; and
  a fuzing unit arranged with the explosive material, the fuzing unit configured to initiate detonation of the explosive material using a capacitive discharge unit (CDU), the CDU comprising:
    an exploding foil initiator (EFI);
    a trigger circuit;
    a firing capacitor; and
    an insulated-gate bipolar transistor IGBT firing switch, the IGBT firing switch including:
      a die encased in a package, the die having an IGBT chip; and
      a gate pin, a collector pin, and an emitter pin, the collector pin and emitter pin each including one or more individual pins having a first end portion electrically connected to the die and an opposite end portion extending outward from the package, and the collector pin having a first end electrically connected to one or more substrate layers of the die and an opposite end extending outward from the package, wherein the gate pin is positioned adjacent to, at most, one of the collector pin and the emitter pin, and wherein a separation between the collector and emitter pins provides about a 2000V isolation; and
    a board for mechanically and electrically supporting the trigger circuit, the EFI, the firing capacitor, and the IGBT firing switch, the CDU having an axial length defined by an ordered arrangement along a CDU axis of two or more of the EFI, the firing capacitor, and the IGBT firing switch, wherein the trigger circuit is offset from the CDU axis such that the trigger circuit does not contribute to the axial length.

18. The munition of claim 17, wherein an axial length of the IGBT firing switch is not more than 0.6 inches.

19. The munition of claim 17, wherein an axial length of the package is not more than 35% of the axial length of the CDU.

20. The munition of claim 17, wherein an axial length of each of the collector pin, emitter pin, and gate pin is not more than 35% of the axial length of the CDU.

* * * * *

UNITED STATES PATENT AND TRADEMARK OFFICE
CERTIFICATE OF CORRECTION

| | | Page 1 of 1 |
|---|---|---|
| PATENT NO. | : 11,927,431 B1 | |
| APPLICATION NO. | : 16/602843 | |
| DATED | : March 12, 2024 | |
| INVENTOR(S) | : Lucas et al. | |

It is certified that error appears in the above-identified patent and that said Letters Patent is hereby corrected as shown below:

On the Title Page

Column 1, Item (51), under "Int. Cl.", Lines 2-5, delete "*F42C 11/04* (2006.01)
*F42D 1/05* (2006.01)
*H01L 23/498* (2006.01)
*H05K 1/18* (2006.01)".

On Page 2, Column 2, Item (57), under "ABSTRACT", Line 10, delete "IBGT" and insert -- IGBT --, therefor.

In the Claims

In Column 19, Claim 15, Line 9, delete "capacitor, and the trigger circuit." and insert -- capacitor. --, therefor.

Signed and Sealed this
Second Day of July, 2024

Katherine Kelly Vidal
*Director of the United States Patent and Trademark Office*